United States Patent
Itaya et al.

[11] Patent Number: 6,147,364
[45] Date of Patent: *Nov. 14, 2000

[54] COMPOUND SEMICONDUCTOR DEVICE FORMED OF NITROGEN-CONTAINING GALLIUM COMPOUND SUCH AS GAN, ALGAN OR INGAN

[75] Inventors: Kazuhiko Itaya, Yokohama; Hidetoshi Fujimoto; Johji Nishio, both of Kawasaki; Mariko Suzuki, Yokohama; Lisa Sugiura, Kawasaki, all of Japan

[73] Assignee: Kabushiki Kaisha Toshiba, Kawasaki, Japan

[*] Notice: This patent is subject to a terminal disclaimer.

[21] Appl. No.: 09/196,221

[22] Filed: Nov. 20, 1998

Related U.S. Application Data

[63] Continuation of application No. 08/802,931, Feb. 20, 1997, Pat. No. 5,903,017.

[30] Foreign Application Priority Data

Feb. 26, 1996 [JP] Japan .................................. 8-038119

[51] Int. Cl.[7] .......................... H01L 31/256; H01L 33/00
[52] U.S. Cl. ................................ 257/76; 257/94; 257/96; 257/97; 257/13; 257/102; 257/103; 257/190; 257/609; 44/45; 44/44
[58] Field of Search ........................... 257/76, 94, 96–97, 257/13, 102–103, 190, 609; 372/44, 45

[56] References Cited

U.S. PATENT DOCUMENTS 5,278,435  1/1994  Van Hove et al. ..................... 257/184
5,290,393  3/1994  Nakamura ............................. 438/509
5,693,963  12/1997 Fujimoto et al. ....................... 257/96

OTHER PUBLICATIONS

Shuji Nakamura et al., "InGaN Multi–Quantum–Well–Structure Laser Diodes with Cleaved Mirror Cavity Facets", JPN.J. Appl.. Phys., vol. 35, No. 28, (pp. L217–L219), Feb. 15, 1996.

Primary Examiner—John Guay
Attorney, Agent, or Firm—Oblon, Spivak, McClelland, Maier & Neustadt, P.C.

[57] ABSTRACT

A gallium nitride (GaN)-based semiconductor device comprises a substrate, a single-crystal layer consisting mainly of GaN with a magnesium (Mg) concentration of $N_{bg1}$ cm$^{-3}$, the single-crystal layer being provided near the substrate and having a thickness of $d_1$ μm, and a semiconductor layer consisting mainly of $Ga_{1-x}Al_xN$ having an Al composition x of at least 0.02 and not higher than 1 and having a thickness of $d_2$ μm. The single-crystal layer is situated between the substrate and the semiconductor layer, and Mg is added to the semiconductor layer at a concentration of $N_{Mg}$ cm$^{-3}$. The Al composition x, the concentration $N_{Mg}$, the concentration $N_{bg1}$, the thickness $d_1$ and the thickness $d_2$ have the following relationship $$d_1/(1600 \times x) < d_2 < 3.6 \times 10^{-3} \times \log N/(x+0.02)+0.02$$

wherein when $N_{Mg} > N_{bg1}$, N cm$^{-3} = N_{Mg} - N_{bg1}$, and when $N_{Mg} \leq N_{bg1}$, N is equal to an Mg background level in additive-free $Ga_{1-x}Al_xN$.

10 Claims, 16 Drawing Sheets

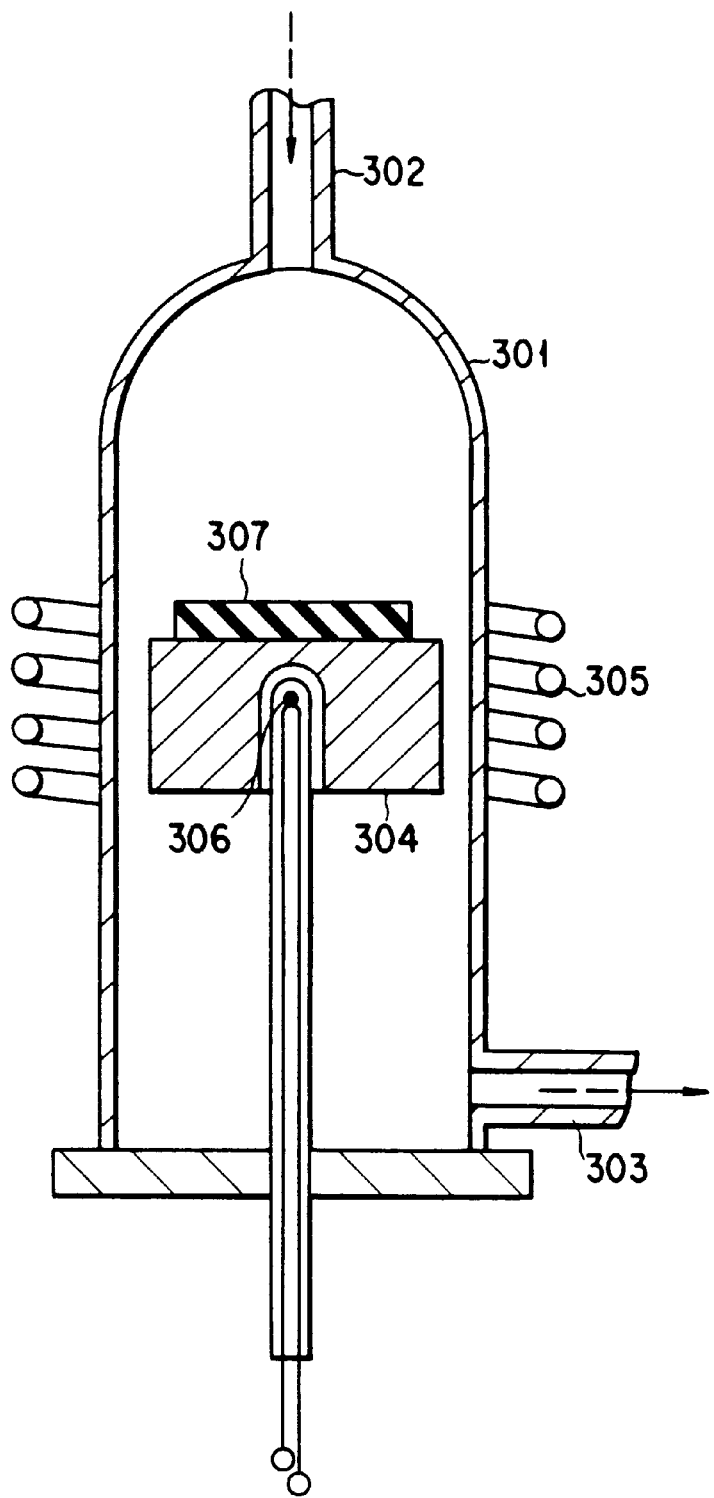
F I G. 1

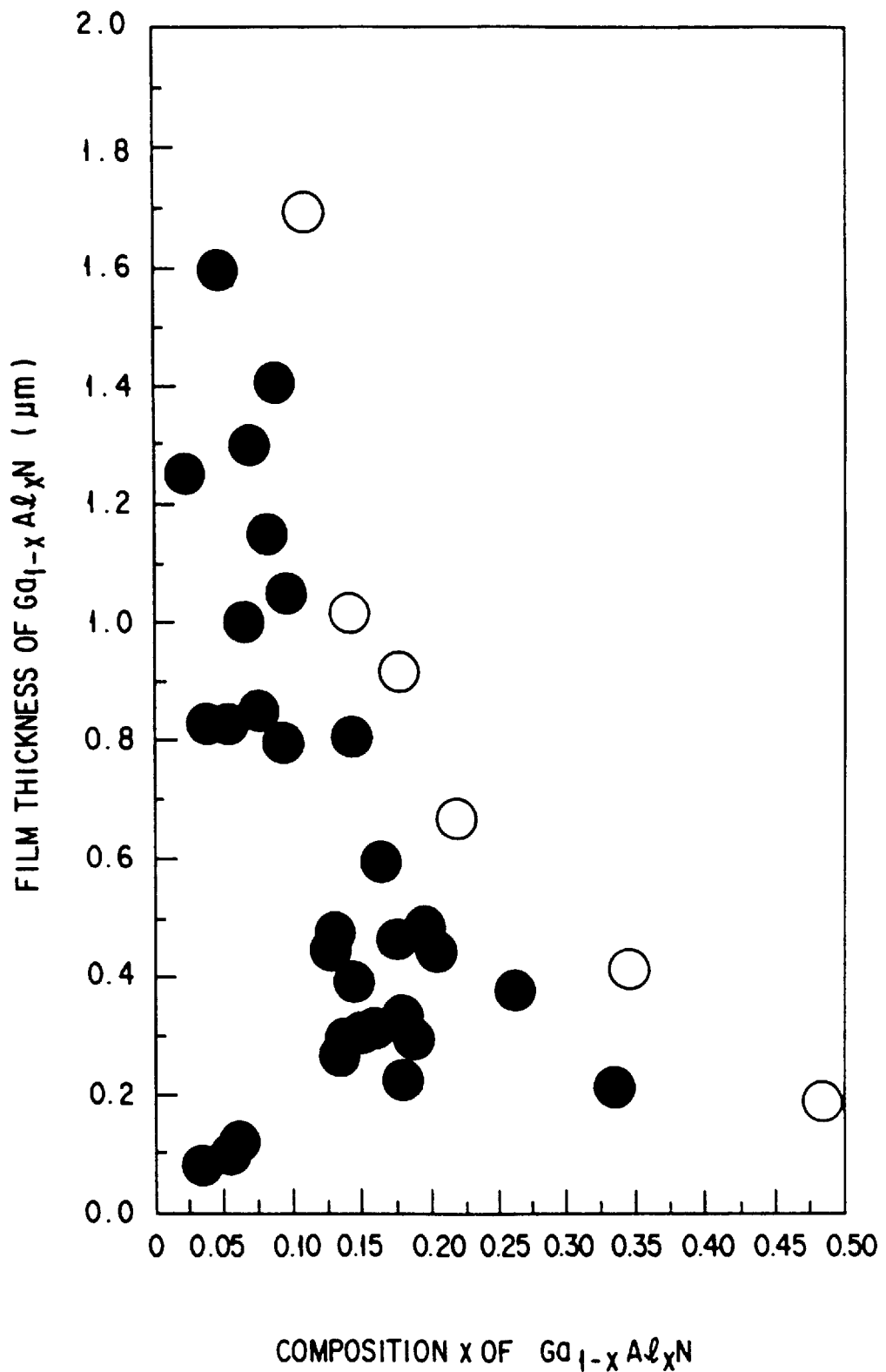
F I G. 2

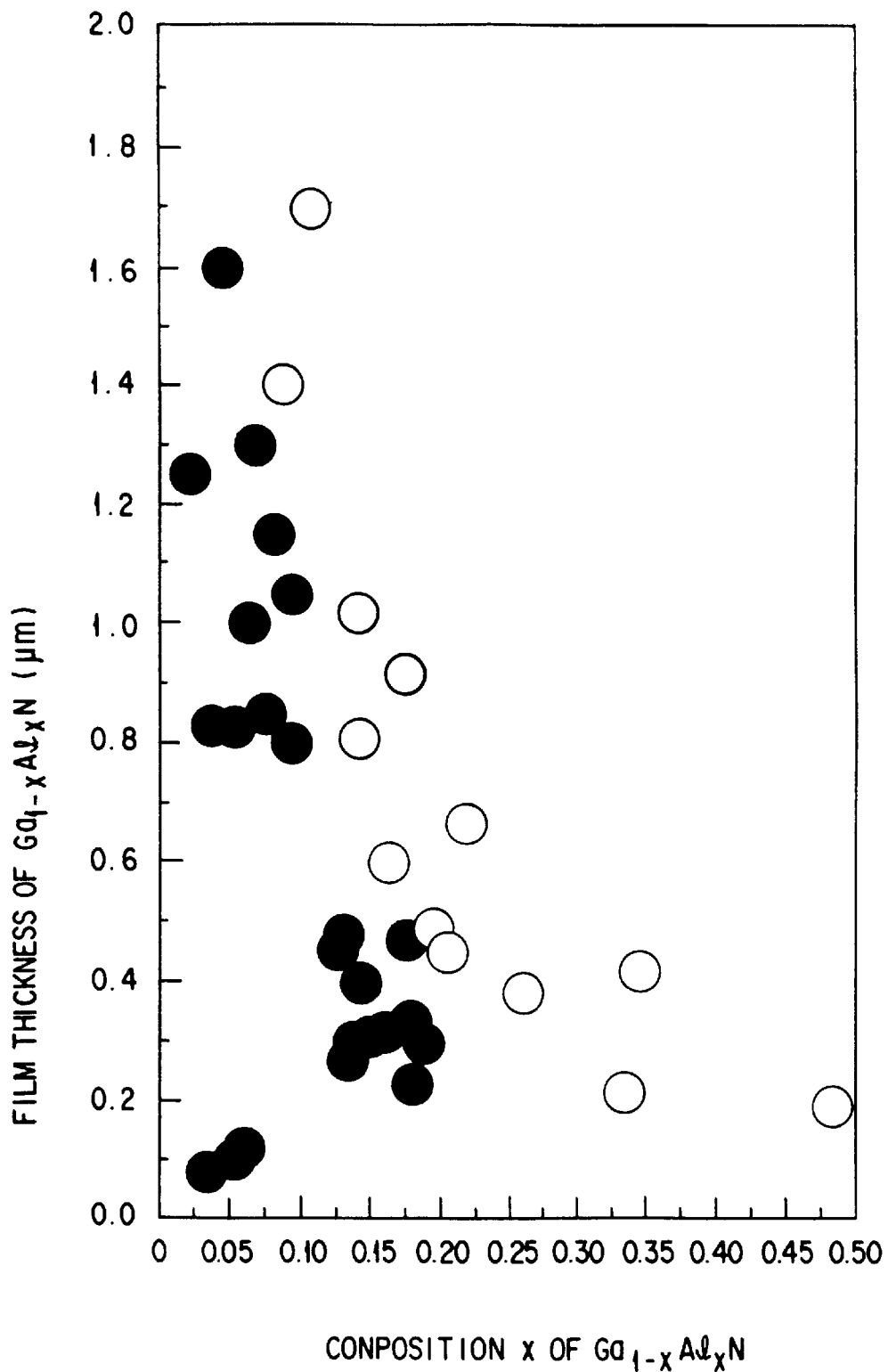
F I G. 3

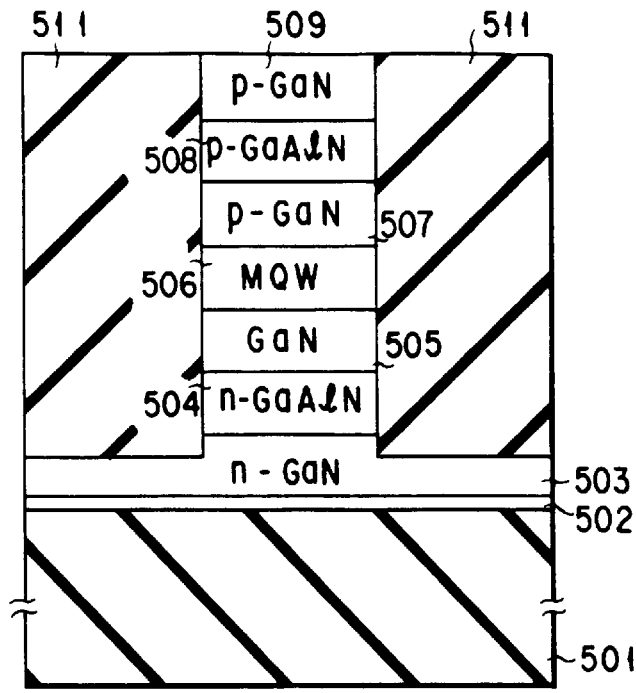
F I G. 8C
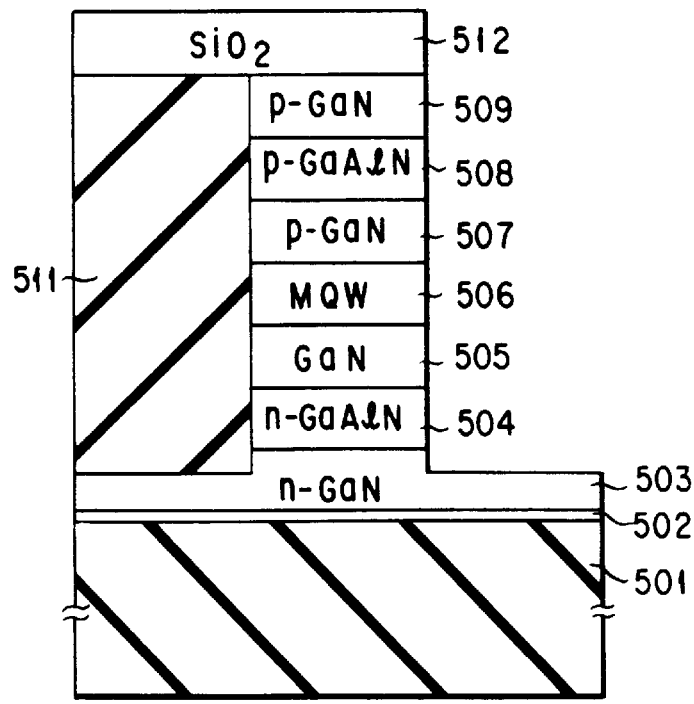
F I G. 8D

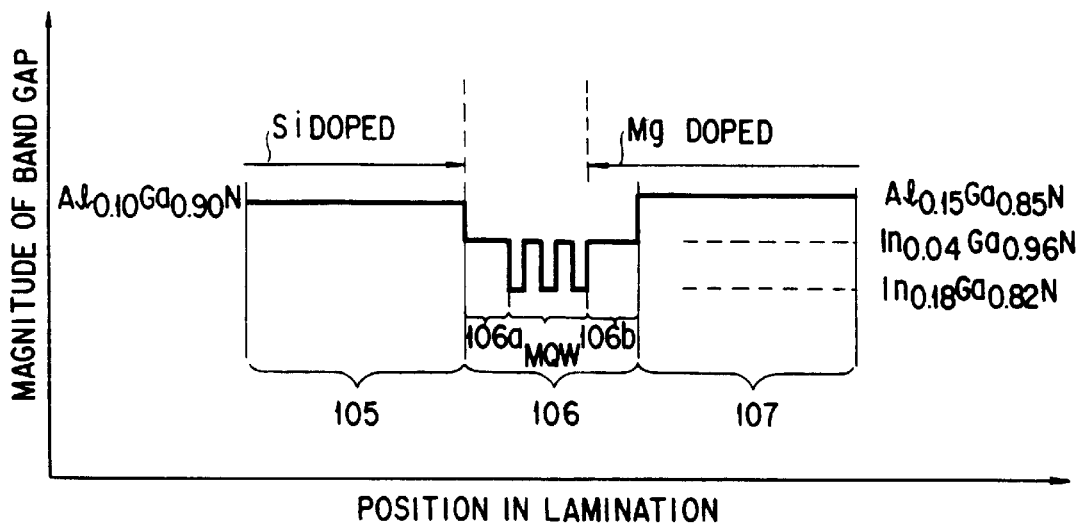
F I G. 12
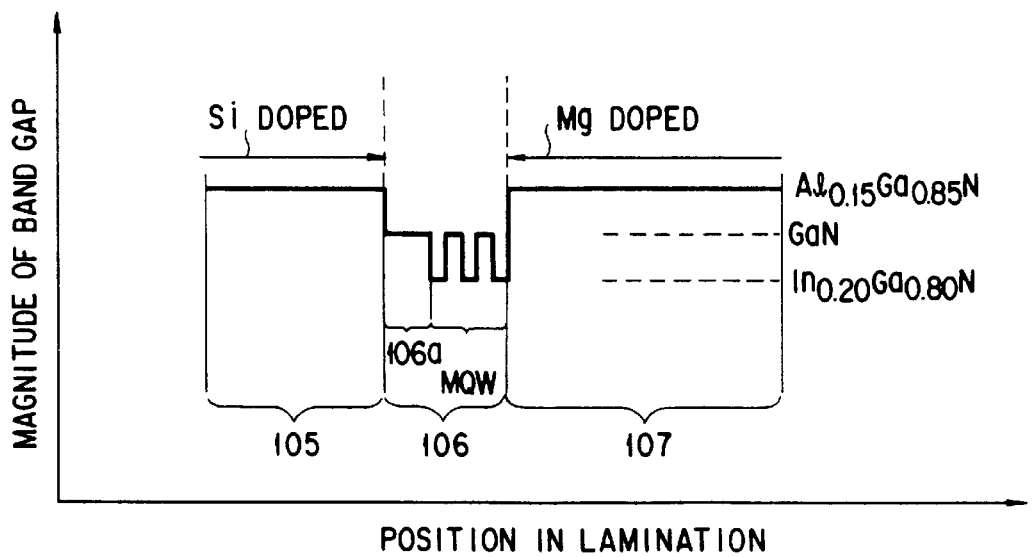
F I G. 13

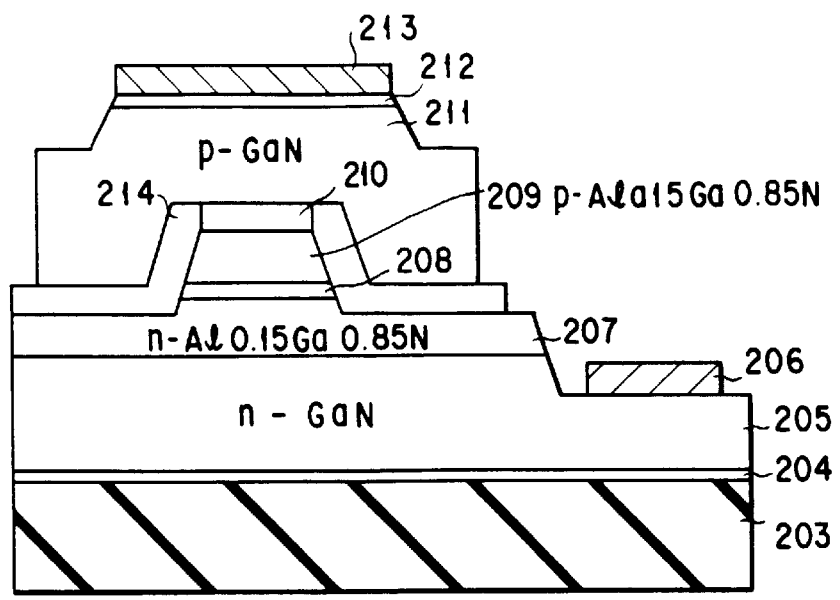
F I G. 14
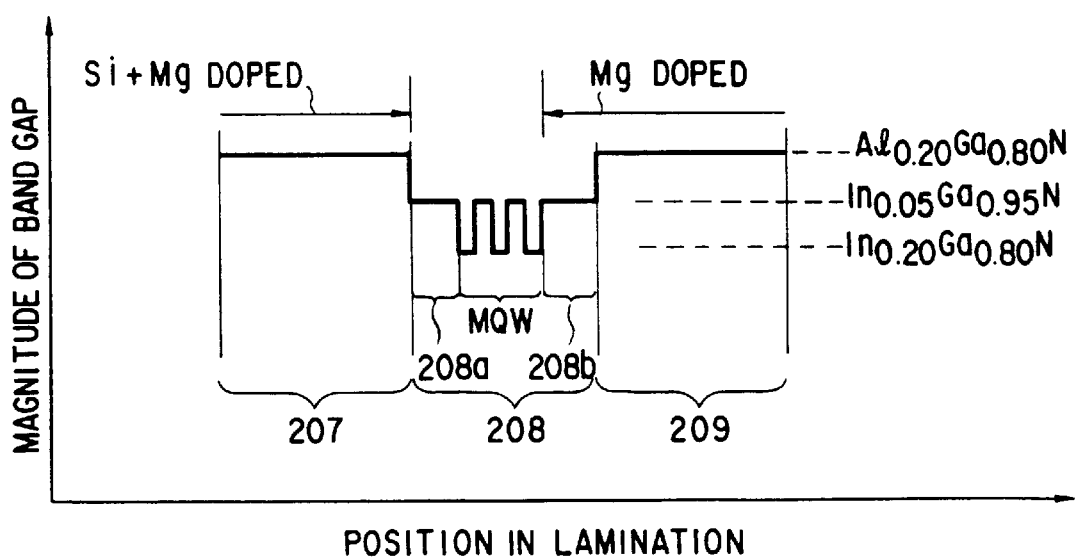
F I G. 15

COMPOUND SEMICONDUCTOR DEVICE FORMED OF NITROGEN-CONTAINING GALLIUM COMPOUND SUCH AS GAN, ALGAN OR INGAN

This application is a continuation of U.S. Ser. No. 08/802,931 filed Feb. 20, 1997, now U.S. Pat. No. 5,903,017.

BACKGROUND OF THE INVENTION

Recently, short-wavelength semiconductor lasers have been developed so that these lasers may be applied to high-density optical disk systems, etc. In order to increase the recording density of recording media, there has been a demand for lasers with shorter oscillation wavelengths. As a short-wavelength semiconductor laser, a 600 nm band light source formed of InGaAlP material has already been put to practical use because the characteristics thereof are improved enough to perform information write/read.

In order to further increase the recording density, blue semiconductor lasers have been intensively developed. Oscillation operations of semiconductor lasers using Groups II–VI elements have already been confirmed. However, it is still difficult to put these lasers to practical use, since the term of reliability is limited to about 100 hours and oscillation is difficult at wavelengths of 480 nm or less. In order to apply these lasers to the next-generation optical disk systems, etc., there are many limitations to semiconductor materials.

On the other hand, with GaN semiconductor lasers, the wavelengths can be decreased to 350 nm or less. In the case of LEDs, it has been confirmed that if proper conditions are chosen, the term of reliability can be increased to 10,000 hours or more. The GaN semiconductor lasers are very prospective, and researches and developments have widely been conducted for GaN semiconductor lasers.

Thus, the GaN compound semiconductor is an excellent material which meets necessary conditions for light sources of the next-generation optical disk systems.

In the meantime, in order to fabricate a semiconductor laser, it is an indispensable condition that light and carriers are confined within an active layer. For this purpose, an AlGaN layer must be used as a cladding layer. In order to obtain a wavelength applicable to an optical disk system, etc. operable at about 400 nm, it is necessary that the Al composition (or composition ratio) in AlGaN be 25% or more and the thickness of each of symmetrical waveguides be 0.3 μm or more.

However, the following problems will arise when the semiconductor laser having the AlGaN layer with high Al composition.

A tensile strain occurs due to a difference in lattice constant between the AlGaN layer and an adjacent GaN layer or a counter substrate. If the thickness of the AlGaN layer exceeds a critical film thickness, a hexagonal crack is made in the surface of the AlGaN layer due to the tensile strain. When a semiconductor laser comprises two kinds of semiconductor layers (i.e. main and sub-semiconductor layers), the critical film thickness refers to a critical film thickness of the sub-semiconductor film at which a crack or dislocation occurs. It is generally thought that a crack, etc. is made in the sub-semiconductor layer at the critical film thickness owing to a strain, etc. resulting from a difference in lattice constant between the main semiconductor layer and the sub-semiconductor layer. If the thickness of the sub-semiconductor layer is much less than its own critical film thickness, no crack, etc. is made. It should be noted that the critical film thickness varies, depending on the kind of semiconductor, combination of materials, and other conditions.

The difference in lattice constant between AlN and GaN is about 2%. Accordingly, about 0.5% of a difference in lattice constant is present between GaN and AlGa containing 20 to 30% of Al, and thus a strain occurs therebetween. When an Al-containing layer is simply grown on a sufficiently thick GaN underlayer, the GaN underlayer functions as a main layer and the growth of the Al-containing layer is influenced by the lattice constant of the GaN underlayer. A tensile strain acts in the AlGaN layer, and a crack will inevitably made if the thickness thereof exceeds the critical film thickness. Specifically, the thickness of an AlGaN cladding layer, which is required to confine light, is about 0.2 to 0.5 μm. This thickness exceeds the critical film thickness of the AlGaN cladding layer in relation to the main layer, i.e. the GaN layer. In this case, a crack will form under normal conditions.

Once the crack has formed, it becomes difficult to flow a current in the semiconductor device in the direction of lamination. The resistance of the device exceeds 50 Ω. With this laser, laser oscillation itself is difficult. Even if the laser oscillates, the reliability of the device is very low. While power is supplied to the device, the characteristics are greatly degraded due to possible residual strain.

In the above example, gallium nitride, one of III–V compound semiconductor containing nitrogen, is mainly applied to the laser. Gallium nitride, GaN, however, is applied not only to lasers but also to various devices such as light-emitting elements, electronic devices and power devices.

The band gap of GaN is 3.4 eV and large, and GaN is a direct transition type compound. Accordingly, GaN is prospective as a material of a short-wavelength light-emitting element, as mentioned above. In addition, a GaN-based material obtained, e.g. by alloying GaN with indium nitride (InN), permits control of a wide band gap. Thus, much attention has been paid to the GaN-based material as a material of a light-emitting device for emitting orange light to ultraviolet light. Furthermore, much attention has been paid to the application of the GaN-based material to power devices, high-temperature operating devices, etc. by making use of its wide band gap.

A substrate for a GaN-based thin film material is required to be stable at high temperatures for growth of the GaN-based material and to have a small difference in lattice constant between the substrate itself and the GaN-based material. In a metal organic chemical vapor deposition (MOCVD) process, sapphire is widely used as a material of a device formation substrate since a substrate with a surface having relatively good characteristics can be obtained and wafers of sapphire with a diameter of about 2 inches can be easily obtained.

However, the degree of mismatching between sapphire and GaN is about 16% and consequently GaN tends to grow in an insular shape on a sapphire substrate. In addition, the dislocation density in a thin film of GaN is about $10^{10}$ cm$^{-2}$ and high. When a sapphire substrate is used, e.g. in a light-emitting device, the light-emission efficiency is low, the operation voltage is high and the yield is low.

For example, a GaN-based light-emitting diode with a light emission wavelength of 520 nm, which is formed on a sapphire substrate, exhibits the following characteristics. As regards light emission efficiency, when an electric current of 20 mA is supplied, the external quantum efficiency is 6%. In this case, the operation voltage is 5V. As regards the life of the diode, when an electric current of 40 mA is supplied, the possibility of defects in a turn-on time period of 1000 hours is 25%. Thus, further increases in light emission efficiency and life and a decrease in operation voltage are to be desired.

In the formation of transistors, which serve as operational elements of power devices, high-temperature devices, high-speed operation devices, etc., there is a problem in a hetero-junction. It is still difficult to put such transistors to practical use.

As in the case of lasers, the problems with the above-described semiconductor devices result from cracks forming in or near $Ga_{1-x}Al_xN$ layers.

Although the possibility of formation of cracks can be reduced by decreasing the value "x" in the composition $Ga_{1-x}Al_xN$, it is known that in this case the life of, in particular, a light-emitting diode is considerably decreased. For example, in the case of a laser diode, the possibility of formation of cracks can be reduced by decreasing the value "x" in the composition $Ga_{1-x}Al_xN$. However, the value of current density increases greatly during laser oscillation and continuous oscillation at room temperature is prevented. In the case of a high-speed operation element, a two-dimensional electron gas is not fully produced if the value "x" is decreased.

As described above, in the conventional GaN-based semiconductor device, it is very difficult to form an AlGaN layer with high Al composition as a cladding layer, etc. since the device resistance increases considerably. In other words, in the GaN-based semiconductor device, it is not possible to increase the life and enhance the operational characteristics at the same time. As a result, in the case of a laser, for example, it is difficult to achieve continuous oscillation.

BRIEF SUMMARY OF THE INVENTION

The object of the present invention is to provide a gallium nitride (GaN)-based semiconductor device wherein a problem of lattice mismatching due to introduction of Al is solved, formation of a crack can be prevented without decreasing the thickness of a $Ga_{1-x}Al_xN$ layer, the Al composition in an AlGaN layer can be increased, and light and carriers can be fully confined in, e.g. an active layer.

According to a first aspect of the invention, there is provided a gallium nitride (GaN)-based semiconductor device comprising:

a substrate;

a single-crystal layer consisting mainly of GaN with a magnesium (Mg) concentration of $N_{bg1}$ cm$^{-3}$, the single-crystal layer being provided near the substrate and having a thickness of $d_1$ μm; and a semiconductor layer consisting mainly of $Ga_{1-x}Al_xN$ having an Al composition x of at least 0.02 and not higher than 1 and having a thickness of $d_2$ μm, the single-crystal layer being situated between the substrate and the semiconductor layer, and Mg being added to the semiconductor layer at a concentration of $N_{Mg}$ cm$^{-3}$, wherein the Al composition x, the concentration $N_{Mg}$, the concentration $N_{bg1}$, the thickness $d_1$ and the thickness $d_2$ have the following relationship:

$$d_1/(1600 \times x) < d_2 < 3.6 \times 10^{-3} \times \log N/(x+0.02)+0.02$$

wherein when $N_{Mg} > N_{bg1}$, $N = N_{Mg} - N_{bg1}$, and when $N_{Mg} \leq N_{bg1}$, N (cm$^{-3}$) is equal to an Mg background level in additive-free $Ga_{1-x}Al_xN$.

In the GaN-based semiconductor device satisfying the above condition, formation of a crack can be prevented in the $Ga_{1-x}Al_xN$ layer and an adjacent layer thereof, without decreasing the thickness of the $Ga_{1-x}Al_xN$ layer. Therefore, if a light-emitting diode is constituted by the GaN-based semiconductor device, the light emission efficiency can be increased and the operational voltage decreased. If a laser diode is constituted by the GaN-based semiconductor device, it can continuously oscillate at room temperature for a longer time period. If an electronic device is constituted by the GaN-based semiconductor device, the operational characteristics thereof can be enhanced.

According to a second aspect, there is provided a gallium nitride (GaN)-based semiconductor device comprising:

a substrate;

a single-crystal layer consisting mainly of GaN with a silicon (Si) concentration of $N_{bg2}$ cm$^{-3}$, the single-crystal layer being provided near the substrate and having a thickness of $d_1$ μm; and a semiconductor layer consisting mainly of $Ga_{1-x}Al_xN$ having an Al composition x of at least 0.02 and not higher than 1 and having a thickness of $d_2$ μm, the single-crystal layer being situated between the substrate and the semiconductor layer, and Si being added to the semiconductor layer at a concentration of $N_{si}$ cm$^{-3}$, wherein the Al composition x, the concentration $N_{si}$, the concentration $N_{bg2}$, the thickness $d_1$ and the thickness $d_2$ have the following relationship:

$$d_1/(1600 \times x) < d_2 < 3.2 \times 10^{-3} \times \log N'/(x+0.02)+0.02$$

wherein when $N_{si} > N_{bg2}$, $N' = N_{si} - N_{bg2}$, and when $N_{si} \leq N_{bg2}$, N' is equal to an Si background level in additive-free $Ga_{1-x}Al_xN$.

In the GaN-based semiconductor device satisfying the above condition, formation of a crack can be prevented in the $Ga_{1-x}Al_xN$ layer and an adjacent layer thereof, without decreasing the thickness of the $Ga_{1-x}Al_xN$ layer. Therefore, if a light-emitting-diode is constituted by the GaN-based semiconductor device, the light emission efficiency can be increased and the operational voltage decreased. If a laser diode is constituted by the GaN-based semiconductor device, it can continuously oscillate at room temperature for a longer time period. If an electronic device is constituted by the GaN-based semiconductor device, the operational characteristics thereof can be enhanced.

According to a third aspect of the invention, there is provided a gallium nitride (GaN)-based semiconductor light emission device comprising:

an active layer formed to emit light;

a p-type cladding layer provided near the active layer; and an n-AlGaN cladding layer provided near the active layer such that the active layer is interposed between the p-type cladding layer and the n-AlGaN cladding layer, Mg, as well as n-type impurities for constituting an n-type semiconductor, being added to the n-AlGaN cladding layer as impurities at a concentration of $10^{19}$ cm$^{-3}$ or more.

According to a fourth aspect of the invention, there is provided a gallium nitride (GaN)-based semiconductor device comprising:

a substrate;

a buffer layer epitaxially grown in contact with the substrate;

at least one AlGaN layer epitaxially grown on the buffer layer; and at least one single-crystal GaN layer epitaxially grown near the substrate and having a thickness less than a critical film thickness, wherein the total thickness of the at least one AlGaN layer is more than half the total thickness of epitaxial layers grown on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically shows the structure of a metal organic chemical vapor deposition (CVD) apparatus for use in crystal growth in an embodiment of the present invention;

FIG. 2 shows a relationship among the composition of a $Ga_{1-x}Al_xN$ layer, the thickness of the $Ga_{1-x}Al_xN$ layer and the formation of cracks, when magnesium is added to the layer;

FIG. 3 shows a relationship among the composition of a $Ga_{1-x}Al_xN$ layer, the thickness of the $Ga_{1-x}Al_xN$ layer and the formation of cracks, when silicon is added to the layer;

FIG. 8C is a cross-sectional view illustrating a step of fabricating the LD according to the second embodiment;

FIG. 8D is a cross-sectional view illustrating a step of fabricating the LD according to the second embodiment;

FIG. 12 shows a band diagram showing conduction-band-side band gaps according to a sixth embodiment of the invention;

FIG. 13 shows a band diagram showing conduction-band-side band gaps according to a seventh embodiment of the invention;

FIG. 14 schematically shows the structure of a blue laser apparatus according to an eighth embodiment of the present invention;

FIG. 15 is a band diagram showing conduction-band-side band gaps according to the eighth embodiment;

DETAILED DESCRIPTION OF THE INVENTION

Figure 4A:
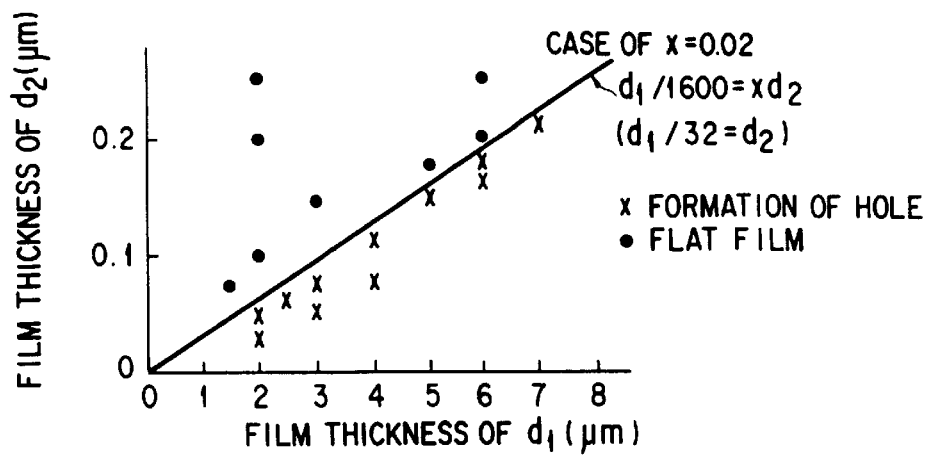
FIG. 4A shows a relationship among the thickness of a GaAlN layer, an Al composition and the thickness of a GaN layer.

Embodiments of the present invention will now be described with reference to the accompanying drawings.

A layer of $Ga_{1-x}Al_xN$ grown on a sapphire substrate, with a layer of GaN, etc. interposed, has a critical film thickness at which a crack due to lattice mismatching does not occur, when a composition x has a certain value. As the value x, i.e. an Al composition, in $Ga_{1-x}Al_xN$ increases, the critical film thickness decreases. It has been thought that cracks tend to form if a high Al composition is obtained due to limitations in physical properties of material.

In fact, this tendency was ascertained in experiments by the inventors and it was confirmed that the possibility of formation of cracks decreased when the thickness of $Ga_{1-x}Al_xN$ film was decreased.

According to the results of other experiments conducted in connection with the addition of Mg and Si in $Ga_{1-x}Al_xN$ layers, it was found that although cracks tended to form similarly as the value x increased, the possibility of formation of cracks decreased as the amount of added Mg increased. Although a similar effect was found with respect to the addition of Si, the effect with the addition of Mg was greater.

Specifically, the Mg-doped AlGaN layer was grown with a less possibility of formation of cracks than an undoped or an Si-doped n-type AlGaN layer. The reproducibility of this effect was good and the film thickness was increased about 20 to 50% as compared to the prior art. In addition, this effect was positively exhibited when the impurity concentration of Mg was in the range of $1 \times 10^{19}$ cm$^{-3}$ to $2 \times 10^{20}$ cm$^{-3}$. Although the reason for this is not clear, the surface morphology of GaN or AlGaN layer varies when Mg is doped at high concentration. It is thought from this that the doping of Mg itself influences the crystal growth mode. In a hexagonal system, it is assumed that dislocation tends to occur in a direction vertical to the plane of growth and a crack forms due to crystal fragility in a vertical direction at a film thickness less than an ordinarily discussed critical film thickness. Based on assumption, it can be thought that the added Mg prevents formation of a crack by enhancing horizontal, two-dimensional growth.

FIG. 1 schematically shows the structure of a metal organic chemical vapor phase deposition (CVD) apparatus for use in crystal growth in an embodiment of the present invention.

In the CVD apparatus shown in FIG. 1, a material gas is supplied from a gas introducing port 302 in a growth vessel 301 formed of quartz and exhausted from a gas exhaust port 303. A susceptor 304 formed of graphite is heated by a radio frequency heating device 305. The temperature of the susceptor 304 is measured and controlled by a W thermocouple 306. A substrate 307 is placed directly on the susceptor 304 and is heated.

Using the CVD apparatus having the above structure, samples were produced, with the composition and thickness of a $Ga_{1-x}Al_xN$ layer varied and with the amount of added Mg or Si varied. The states of formation of cracks in the samples were examined. FIGS. 2 and 3 show the results.

FIG. 2 shows a relationship among the composition of the $Ga_{1-x}Al_xN$ layer, the thickness of the $Ga_{1-x}Al_xN$ layer and the formation of cracks, when magnesium is added to the layer.

FIG. 3 shows a relationship among the composition of the $Ga_{1-x}Al_xN$ layer, the thickness of the $Ga_{1-x}Al_xN$ layer and the formation of cracks, when silicon is added to the layer.

In FIGS. 2 and 3, circles in black indicate samples with no crack and circles in white indicate samples with cracks which were determined by an optical microscope. In FIG. 2, samples contain various amounts of added Mg, and the Mg concentration in the samples ranges from $5 \times 10^{18}$ to $1 \times 10^{20}$ (cm$^{-3}$). On the other hand, in FIG. 3, samples contain various amounts of added Si, and the Si concentration in the samples ranges from $5 \times 10^{17}$ to $1 \times 10^{19}$ (cm$^{-3}$).

As compared to a case where no Mg or Si is added, if Mg or Si is added, the $Ga_{1-x}Al_xN$ layer can be increased without formation of a crack, as described above. Even in the case where Mg or Si is added, there is a predetermined relationship among various factors, as seen from FIGS. 2 and 3.

Although not shown in FIGS. 2 and 3, similar experiments were carried out and it was found that the greater the amount of added Mg or Si, the higher the crack prevention effect and that the thinner the underlayer of the $Ga_{1-x}Al_xN$ layer, the lower the possibility of formation of cracks. The "underlayer" in this context is not necessarily a layer put in direct contact with the $Ga_{1-x}Al_xN$ layer and it refers to a layer capable of mainly causing a strain in the $Ga_{1-x}Al_xN$ layer. Accordingly, in some cases, the $Ga_{1-x}Al_xN$ layer is provided on the underlayer with a relatively thin layer interposed.

It is thought that the crack prevention effect is similar to an effect in which occurrence or an increase of dislocation can be suppressed by adding indium, silicon, etc. while a crystal of gallium arsenide or a III–V compound semiconductor is being grown.

The inventors found that the addition of an element to the underlayer is associated with the formation of cracks in the $Ga_{1-x}Al_xN$ layer.

According to other experimental data, it was found that when a semiconductor device is fabricated by joining the $Ga_{1-x}Al_xN$ layer to an $In_{1-x}Ga_xN(0 \leq x \leq 1)$, the crack prevention effect is hardly attained unless the Al composition value x in $Ga_{1-x}Al_xN$ is 0.02 or more.

In order to understand the relationship between the formation of cracks and various factors on the basis of the experimental results, it is necessary to numerically express the influences of the amount of added Mg or Si, the thickness of the underlayer, the concentration of Mg or Si in the underlayer, and the Al composition. When the $Ga_{1-x}Al_xN$ layer is grown, holes may form in this layer depending on the condition of growth. Since such holes may adversely affect a semiconductor device to be fabricated, it is also necessary to find the condition for growth under which no holes will form. The procedure for numerically expressing the conditions under which cracks or holes will form will now be described.

It was found that if the thickness of a GaN layer (hereinafter referred to as "GaN underlayer") grown on a sapphire substrate with a nucleus formation layer interposed varies, a strain acting in a $Ga_{1-x}Al_xN$ layer grown on the GaN underlayer varies. Using the apparatus shown in FIG. 1, a sample was grown on the GaN underlayer while the thickness of the GaN layer was varied and the value x and thickness (i.e. time of growth) of the $Ga_{1-x}Al_xN$ layer were varied.

After the sample was grown, limit values were examined at which a mirror-like flat surface of the $Ga_{1-x}Al_xN$ layer was observed by the naked eye and the presence of a hole was not recognized by a scanning electron microscope.

In the case where the value x in the $Ga_{1-x}Al_xN$ was unchanged, the presence of a hole in the surface was observed by the scanning electron microscope when the $Ga_{1-x}Al_xN$ was thin. The same phenomenon was observed when the value x was unchanged and the GaN underlayer was thin. If such holes are present, for example, a seed of added impurities is precipitated or abnormal diffusion occurs through the holes. Thus, the presence of holes makes earlier the degradation of the device. In order to elongate the life of the device, the formation of such holes must be avoided.

Figure 4B:
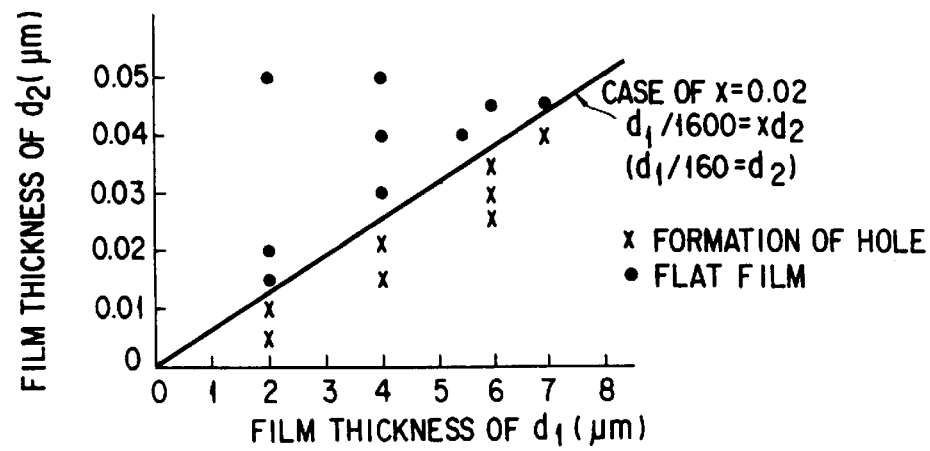
FIG. 4B shows a relationship among the thickness of a GaAlN layer, an Al composition and the thickness of a GaN layer.
Figure 4C:
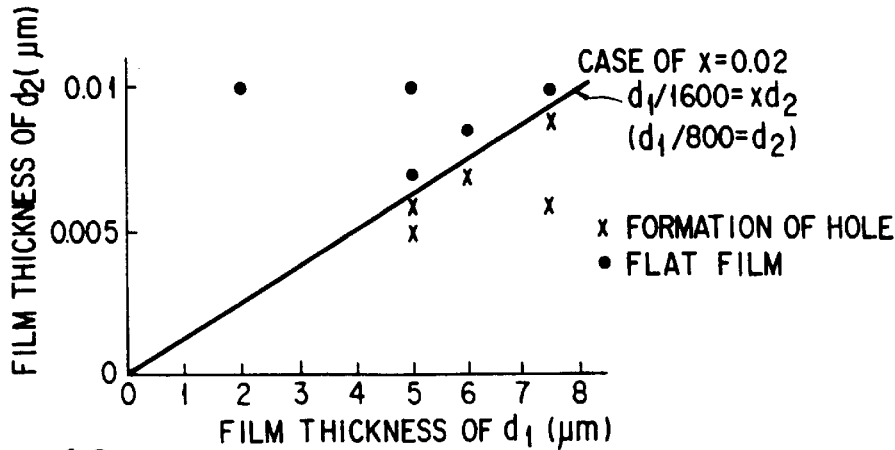
FIG. 4C shows a relationship among the thickness of a GaAlN layer, an Al composition and the thickness of a GaN layer.

It was found by the above experiments that when the value x (Al composition) was high, the possibility of formation of holes increased in accordance with the increase in the value x, and that the critical film thickness of formation of holes increased by decreasing the value x even if the film thickness was unchanged or the ratio in thickness between the $Ga_{1-x}Al_xN$ and the GaN underlayer remained the same. FIGS. 4A, 4B and 4C show the results of experiments.

Each of FIGS. 4A, 4B and 4C shows the relationship among the thickness of the GaAlN layer, the Al composition in the GaAlN layer, and the thickness of the GaN layer.

On the basis of the experimental results of FIGS. 4A to 4C, the fitting operation was carried out and the conditions under which no hole would form were formulated. Specifically, in order that a mirror-like flat surface of the $Ga_{1-x}Al_xN$ layer may be observed by the naked eye and the presence of a hole may not be recognized by a scanning electron microscope, the following relationship needs to be satisfied:

$$d_1/1600 < xd_2 (0.02 \leq x \leq 1) \quad (1)$$

where $d_1$ (μm)=the thickness of GaN underlayer, and $d_2$ (μm)=the thickness of the $Ga_{1-x}Al_xN$ If the $Ga_{1-x}Al_xN$ has a certain thickness or more, the formation of the holes can be prevented. Specifically, if the composition x is determined according to formula (1), as shown in FIGS. 4A to 4C, the formation of holes can be prevented.

In the case of the addition of at least Mg or Si, it was confirmed that the formula (1) holds true, independent of the seed of added impurities or the amount of additive in the GaN underlayer or $Ga_{1-x}Al_xN$ layer.

The factors of formation of cracks will now be described. It is widely known that the critical film thickness at which no crack will form decreases in accordance with the increase in composition x. It was found that this relationship was supported if the experimental data was approximated by inverse proportion.

As mentioned above, the formation of cracks is suppressed by adding magnesium (Mg) or silicon (Si). However, if the concentration of impurities (Mg or Si), which are of the same kind as in the $Ga_{1-x}Al_xN$ layer, is high in the GaN underlayer, the effect of suppression decreases. If the same kind of impurities are present in the GaN underlayer and the $Ga_{1-x}Al_xN$ layer, a difference in impurities contributes to prevention of cracks. Thus, if Mg is contained in the $Ga_{1-x}Al_xN$ and silicon alone is added in the GaN underlayer, the crack prevention effect can be explained with reference to only the Mg concentration.

Besides, it was found that if the impurity concentration in the GaN underlayer is higher, the critical film thickness for formation of cracks is the same as in the case of the $Ga_{1-x}Al_xN$ with no additive, irrespective of the impurity concentration, composition and film thickness of the $Ga_{1-x}Al_xN$ layer.

Figure 5:
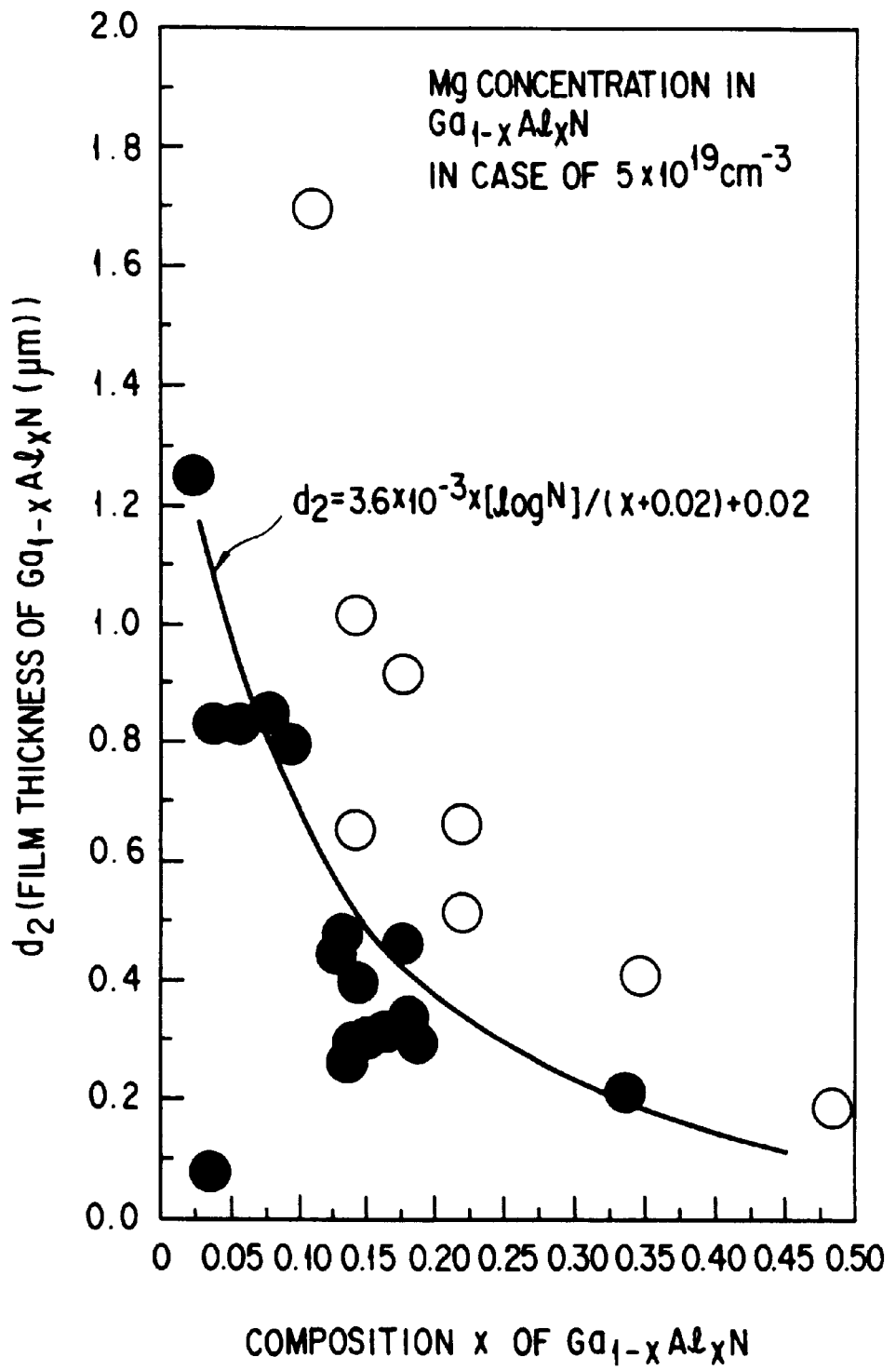
FIG. 5 shows a relationship among the composition of a $Ga_{1-x}Al_xN$ layer, the thickness of the $Ga_{1-x}Al_xN$ layer and the formation of cracks, in a sample obtained with magnesium added.

FIG. 5 shows a relationship among the composition of a $Ga_{1-x}Al_xN$ layer, the thickness of the $Ga_{1-x}Al_xN$ layer and the formation of cracks, in a sample obtained with magnesium added.

In FIG. 5, experimental data obtained when the Mg concentration was $5 \times 10^{19}$ (cm$^{-3}$) is extracted from the data shown in FIG. 2 in which the amount of added Mg was varied, and further experimental data obtained with the same Mg concentration is added. Circles in black indicate samples with no crack and circles in white indicate samples with cracks which were determined by an optical microscope.

On the basis of the data shown in FIG. 5, the conditions under which no crack will form are formulated. When Mg is added to the $Ga_{1-x}Al_xN$ layer, the film thickness $d_2$ of the $Ga_{1-x}Al_xN$ layer at which no crack will form can be expressed by the following formula (2). This is obvious by the fitting in FIG. 5. Specifically, when the added impurities are Mg, $$d_2 < 3.6 \times 10^{-3} \times \log N/(x+0.02) + 0.02 \quad (2)$$

from the relationship between the Mg concentration $N_{Mg}$ (cm$^{-3}$) in the $Ga_{1-x}Al_xN$ layer and the Mg concentration $N_{bg1}$ (cm$^{-3}$) in the GaN underlayer.

In formula (2), when $N_{Mg} > N_{bg1}$, N (cm$^{-3}$) is $N = N_{Mg} - N_{bg1}$. When $N_{Mg} \leq N_{bg1}$, N (cm$^{-3}$) is equal to the Mg background level in the $Ga_{1-x}Al_xN$ layer ($0.02 \leq x \leq 1$) with no additive. Although not shown, formula (2) is applicable to each Mg concentration in FIG. 2. Specifically, in accordance with the Mg concentration $N_{Mg}$ in the $Ga_{1-x}Al_xN$ layer, a line similar to the fitting line in FIG. 2 ($d_2 = 3.6 \times 10^{-3} \times \log N/(x+0.02) + 0.02$) shifts vertically in FIG. 2. If the Mg concentration is high, the fitting line goes upward. If the Mg concentration is low, the fitting line goes down.

Figure 6:
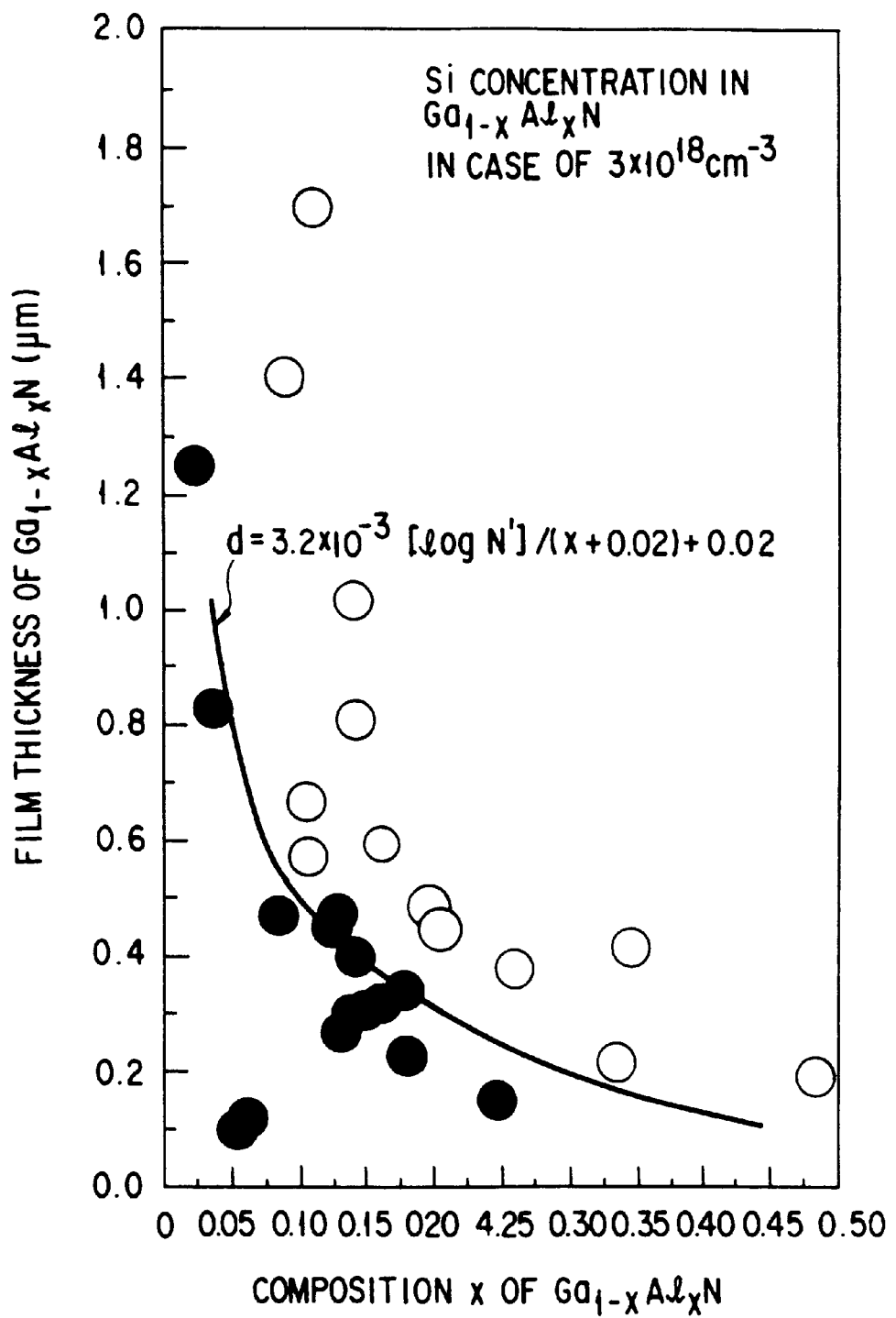
FIG. 6 shows a relationship among the composition of a $Ga_{1-x}Al_xN$ layer, the thickness of the $Ga_{1-x}Al_xN$ layer and the formation of cracks, in a sample obtained with silicon added.

FIG. 6 shows a relationship among the composition of a $Ga_{1-x}Al_xN$ layer, the thickness of the $Ga_{1-x}Al_xN$ layer and the formation of cracks, in a sample obtained with silicon added.

In FIG. 6, experimental data obtained when the Si concentration was $3 \times 10^{18}$ (cm$^{-3}$) is extracted from the data shown in FIG. 3 in which the amount of added Si was varied, and further experimental data obtained with the same Si concentration is added. Circles in black indicate samples with no crack and circles in white indicate samples with cracks which were determined by an optical microscope.

On the basis of the data shown in FIG. 6, the conditions under which no crack will form are formulated. Specifically, when the added impurities are Si, $$d_2 < 3.2 \times 10^{-3} \times \log N'/(x+0.02) + 0.02 \quad (3)$$

from the relationship between the Si concentration $N_{si}$ (cm$^{-3}$) in the $Ga_{1-x}Al_xN$ layer and the Si concentration $N_{bg2}$ (cm$^{-3}$) in the GaN underlayer.

In formula (3), when $N_{si} > N_{bg2}$, N' (cm$^{-3}$) is $N = N_{si} - N_{bg2}$. When $N_{si} \leq N_{bg2}$, N' (cm$^{-3}$) is equal to the Si background level in the $Ga_{1-x}Al_xN$ layer ($0.02 \leq x \leq 1$) with no additive. Although not shown, formula (3) is applicable to each Si concentration in FIG. 3. Specifically, in accordance with the Si concentration $N_{si}$ in the $Ga_{1-x}Al_xN$ layer, a line similar to the fitting line in FIG. 3 ($d_2 = 3.2 \times 10^{-3} + \log N'/(x+0.02) + 0.02$) shifts vertically in FIG. 3. If the Si concentration is high, the fitting line goes upward. If the Si concentration is low, the fitting line goes down.

As described above, the relationship among the thickness of the $Ga_{1-x}Al_xN$ at which cracks will form and the amount of Mg or Si added to the $Ga_{1-x}Al_xN$ layer and the underlayer was clarified.

In summary, the range of thickness $d_2$ of the $Ga_{1-x}Al_xN$ for obtaining a GaN-based semiconductor device in which no crack forms and no hole is observed on a surface thereof by a scanning electron microscope is expressed by the following formula (4). In the case of addition of Mg, this range is determined from formulae (1) and (2) on the basis of the relationship between the Mg concentration $N_{Mg}$ (cm$^{-3}$) in the $Ga_{1-x}Al_xN$ layer and the Mg concentration $N_{bg1}$ (cm$^{-3}$) in the GaN underlayer.

$$d_1/(1600 \times x) < d_2 < 3.6 \times 10^{-3} \times \log N/(x+0.02) + 0.02 \quad (4)$$

In formula (4), when $N_{Mg} > N_{bg1}$, N (cm$^{-3}$) is $N = N_{Mg} - N_{bg1}$. When $N_{Mg} \leq N_{bg1}$, N (cm$^{-3}$) is equal to the Mg background level in the additive-free $Ga_{1-x}Al_xN$ layer ($0.02 \leq x \leq 1$).

On the other hand, in the case where the impurities are Si, this range is determined from formulae (1) and (3) on the basis of the relationship between the Si concentration $N_{si}$ (cm$^{-3}$) in the $Ga_{1-x}Al_xN$ layer and the Si concentration $N_{bg2}$ (cm$^{-3}$) in the GaN underlayer, and is expressed by the following formula (5):

$$d_1/(1600 \times x) < d_2 < 3.2 \times 10^{-3} \times \log N'/(x+0.02) + 0.02 \quad (5)$$

In formula (5), when $N_{si} > N_{bg2}$, N' (cm$^{-3}$) is $N' = N_{si} - N_{bg2}$. When $N_{si} \leq N_{bg2}$, N' (cm$^{-3}$) is equal to the Si background level in the $Ga_{1-x}Al_xN$ layer ($0.02 \leq x \leq 1$) with no additive.

In each of formulae (1) to (5) the sign of inequality "<" is used in order to indicate a "safe" range in which formation of a crack or a hole is surely prevented.

According to this embodiment, a gallium nitride (GaN) based semiconductor device in which no crack forms and no hole is observed is provided if, in a GaN-based semiconductor lamination structure including a layer consisting mainly of $Ga_{1-x}Al_xN$, the relationship among the thickness $d_2$ ($\mu$m) of a $Ga_{1-x}Al_xN$ layer ($0.02 \leq x \leq 1$) containing Mg, the composition x in the $Ga_{1-x}Al_xN$ layer, the Mg concentration $N_{Mg}$ in the $Ga_{1-x}Al_xN$ layer, the thickness $d_1$ of a single crystal layer consisting mainly of GaN provided closest to a substrate, and the Mg concentration $N_{bg1}$ (cm$^{-3}$) satisfies the formula (4).

In addition, according to this embodiment, a gallium nitride (GaN) based semiconductor device in which no crack forms and no hole is observed is provided if, in a GaN-based semiconductor lamination structure including a layer consisting mainly of $Ga_{1-x}Al_xN$, the relationship among the thickness $d_2$ ($\mu$m) of a $Ga_{1-x}Al_xN$ layer containing Si, the composition x in the $Ga_{1-x}Al_xN$ layer, the Si concentration $N_{si}$ in the $Ga_{1-x}Al_xN$ layer, the thickness $d_1$ of a single crystal layer consisting mainly of GaN provided closest to a substrate, and the Si concentration $N_{bg2}$ (cm$^{-3}$) satisfies the formula (5).

According to the semiconductor device of this invention, the thickness of the $Ga_{1-x}Al_xN$ layer is decreased without formation of holes which can be observed by an electron microscope. In addition, formation of cracks can be suppressed under a condition under which cracks formed in the prior art. Accordingly, when the present invention is applied to a light-emitting diode (LED), the light emission efficiency of the LED is increased, and the operation voltage is reduced. When the invention is applied to a laser diode, the time of continuous oscillation at room temperature is increased. When the invention is applied to an electronic device, the degree of degradation can be remarkably improved and the operational characteristics can be enhanced. Therefore, long-life semiconductor devices can be produced.

(First Embodiment)

In a first embodiment of the invention, a light-emitting diode (LED) was fabricated so that the above-described formulae (1) and (2) could be satisfied. The characteristics of the fabricated LED were examined. The LED was fabricated by using the metal organic CVD apparatus shown in FIG. 1.

Figure 7A:
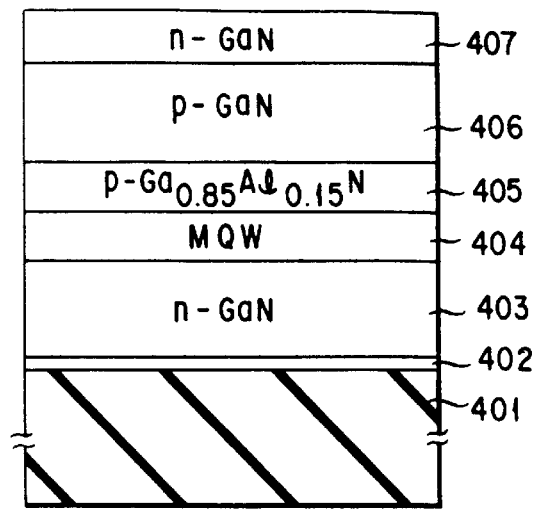
FIG. 7A is a cross-sectional view illustrating a step of fabricating a light-emitting diode (LED) according to a first embodiment of the present invention.
Figure 7B:
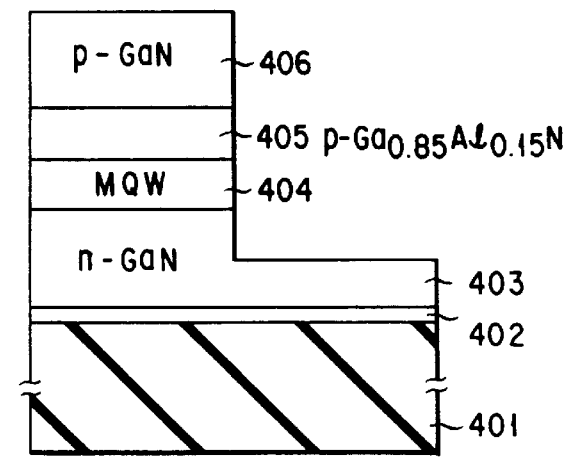
FIG. 7B is a cross-sectional view illustrating a step of fabricating the LED according to the first embodiment.
Figure 7C:
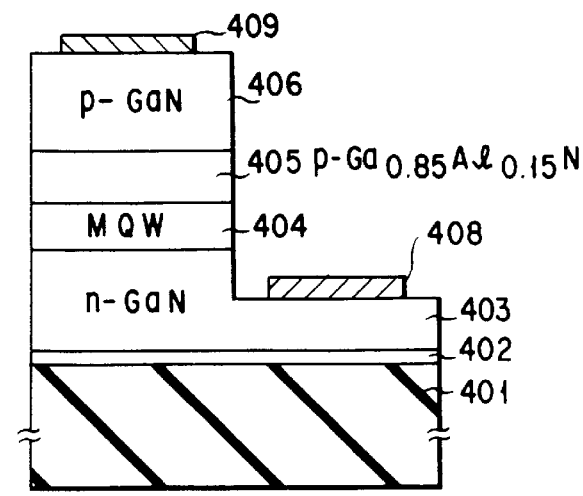
FIG. 7C is a cross-sectional view illustrating a step of fabricating the LED according to the first embodiment.

FIGS. 7A, 7B and 7C are cross-sectional views illustrating the steps of manufacturing the LED of the first embodiment.

In the CVD apparatus shown in FIG. 1, while hydrogen was supplied from the gas introducing port 302, power was supplied to the radio-frequency heating device 305, thereby heating a sapphire substrate 401 on the susceptor 304 (or the substrate 307 in FIG. 1). The temperature in the vessel 301 was controlled at 1200° C. which was indicated by the thermocouple 306. Hereinafter, the temperature indicated by the thermocouple 306 is simply called "temperature". The temperature was kept at 1200° C. for ten minutes and then lowered to 600° C. When the temperature was stabilized, the supply of trimethyl gallium (TMG), trimethyl aluminum (TMA) and ammonia gas was started, and a $Ga_{0.9}Al_{0.1}N$ buffer layer 402 about 30 nm thick was grown. Subsequently, the supply of TMG and TMA was stopped and the temperature was raised once again up to 1200° C.

Thereafter, the supply of silane gas diluted with hydrogen and of TMG was started, and an n-type GaN layer 403 containing silicon was grown to a thickness of 4 $\mu$m. The supply of TMG and silane was stopped and the temperature was lowered to 800° C. After the temperature was stabilized, TMG and TMI was supplied. Using a line for TMG and TMI, an active layer 404 of a multi-quantum well (MQW) structure comprising 20 pairs of well layers of $In_{0.15}Ga_{0.85}N$ and barrier layers of $In_{0.05}Ga_{0.95}N$ were formed. The supply of TMI was stopped and the temperature was restored to 1200° C. After the temperature was stabilized, bis (cyclopentene)magnesium ("Cp$_2$Mg") and MTA were additionally supplied, and a p-type $Ga_{0.85}Al_{0.15}N$ layer 405 containing Mg was grown to a thickness of 0.3 $\mu$m.

Subsequently, the supply of TMA was stopped and in this state a p-type GaN layer 406 containing Mg was grown to a thickness of 1 $\mu$m. Then, the supply of Cp$_2$Mg was stopped and at the same time silane gas diluted with hydrogen was supplied, thereby growing an n-type GaN layer 407 with a thickness of 0.05 $\mu$m.

Then, the supply of TMG and silane gas was stopped and power to the radio-frequency heating device 305 was stopped. When the temperature fell to 850° C., the supply of ammonia was stopped.

The wafer was taken out of the growth vessel 301 and inspected by the naked eye, and it was found that the wafer has a mirror surface. No characteristic surface pattern was observed even by means of a differential interference microscope. Specifically, no crack was observed on the wafer surface. In the state shown in FIG. 7A, the surface condition of the wafer was observed by a scanning electron microscope and it was found that the surface was flat and there was no characteristic pattern such as a hole, a projection or a curve.

The entire surface of the thus obtained wafer was subjected to reactive ion etching (RIE) and etched away down to the Mg-containing p-type GaN layer 406.

Then, the condition for etching was determined on the basis of the distance between the uppermost surface observed by a cross-sectional electron microscope and the n-type GaN layer 403, and a portion of the wafer was etched away by RIE down to the Si-containing n-type GaN layer 403, with an SiO$_2$ film used as a mask, as shown in FIG. 7B.

Subsequently, as shown in FIG. 7C, an n-type electrode 408 of an Ti—Al alloy and a p-type electrode 409 of a Zn—Au alloy were formed. It was confirmed that excellent n-type and p-type ohmic contacts were achieved without performing special heat treatment.

In the above-described LED, the GaN underlayer 403 is 4 $\mu$m thick. The $Ga_{1-x}Al_xN$ layer 405 is admixed with Mg, and the composition x is 0.15 and the thickness thereof is 0.3 $\mu$m. From the measurement result of Mg concentration by the secondary ion mass spectrometry, it was found that $N_{Mg}$ in formula (4) was $1.2 \times 10^{19}$ cm$^{-3}$. The value of $N_{bg1}$ was equal to a background level ($1.0 \times 10^{16}$ cm$^{-3}$). Thus, the condition of formation of a hole observed by a scanning electron microscope is $4/(1600 \times 0.15) = 0.0167$ $\mu$m, which is lower than the value of $d_2$, i.e. 0.3 $\mu$m.

From formula (4), $N_{Mg} > N_{bg1}$. Thus, N is $1.2 \times 10^{19} - 1.0 \times 10^{16}$ = about $1.2 \times 10^{19}$. Accordingly the condition of formation of a crack is $3.6 \times 10^{-3} \times [\log(1.2 \times 10^{19})]/(0.15 + 0.02) + 0.02 = 0.42$ $\mu$m, which is lower than the value of $d_2$, i.e. 0.3 $\mu$m.

The optical characteristics of the LED were examined. The peak of emission light wavelength was 420 nm. With a low voltage of 3.6V a current of 20 mA was caused to flow. As regards the light emission efficiency, the external quantum efficiency was 13.4% and very high. The life of the LED was tested with a current of 40 mA. The probability of a fault after 1000 hours was 1% or less, and it was confirmed that the life was elongated.

According to the semiconductor light-emitting device (LED) of the first embodiment of the invention, the kind of additive in each layer, the concentration of additive and the thickness of each layer were controlled so as to meet the formula (4). Therefore, the life of the LED can be remarkably increased, the light emission efficiency enhanced, and the operational voltage decreased.

(Second Embodiment)

In a second embodiment of the invention, a blue laser diode was fabricated so that the above-described formulae (4) and (5) could be satisfied. The characteristics of the diode were examined. The blue laser diode was fabricated by using the metal organic CVD apparatus shown in FIG. 1.

FIGS. 8A, 8B, 8C and 8D are cross-sectional views illustrating the steps of manufacturing the laser diode of the second embodiment.

In the CVD apparatus shown in FIG. 1, while hydrogen was supplied from the gas introducing port 302, power was supplied to the radio-frequency heating device 305, thereby heating a sapphire substrate 501 on the susceptor 304. The temperature was controlled at 1200° C. and kept for ten minutes and then lowered to 600° C. When the temperature was stabilized, the supply of TMG and ammonia gas was started, and a GaN buffer layer 502 about 40 nm thick was grown. Subsequently, the supply of TMG was stopped and the temperature was raised once again up to 1200° C.

Thereafter, the supply of silane gas diluted with hydrogen and of TMG was started, and an n-type GaN layer 503 containing silicon was grown to a thickness of 4 $\mu$m. With TMA additionally supplied, an n-type Si-containing $Ga_{0.85}Al_{0.15}N$ layer 504 was grown to a thickness of 0.3 $\mu$m. The supply of TMA and silane gas was stopped, and a GaN layer 505 containing no additive was grown to a thickness of 0.1 $\mu$m. Then, the supply of TMG and silane was stopped and the temperature was lowered to 800° C. After the temperature was stabilized, TMG was supplied and a GaN barrier layer 4 nm thick was grown. With TMI additionally supplied, a well layer of $In_{0.15}Ga_{0.85}N$ was grown to a thickness of 2 nm. The growth of the barrier layer and well layer was repeated 20 times, thereby forming an active layer 506 of a multi-quantum well (MQW) structure. The supply of TMI was stopped and the temperature was restored to 1200° C. After the temperature was stabilized, $Cp_2Mg$ was additionally supplied, and a p-type GaN layer 508 was grown to a thickness of 0.1 $\mu$m.

Then, TMA was additionally supplied and a p-type $Ga_{0.85}Al_{0.15}N$ layer 508 containing Mg was grown to a thickness of 0.3 $\mu$m. Subsequently, the supply of TMA was stopped and in this state a p-type GaN layer 509 containing Mg was grown to a thickness of 1 $\mu$m.

Then, the supply of TMG and $Cp_2Mg$ was stopped and power to the radio-frequency heating device 305 was stopped. When the temperature fell to 850° C., the supply of ammonia was stopped.

The wafer was taken out of the growth vessel 301 and inspected by the naked eye, and it was found that the wafer has a mirror surface. No characteristic surface pattern was observed even by means of a differential interference microscope. Specifically, no crack was observed on the wafer surface. The surface condition of the wafer was observed by a scanning electron microscope and it was found that the surface was flat and there was no characteristic pattern such as a hole, a projection or a curve.

Figure 8A:
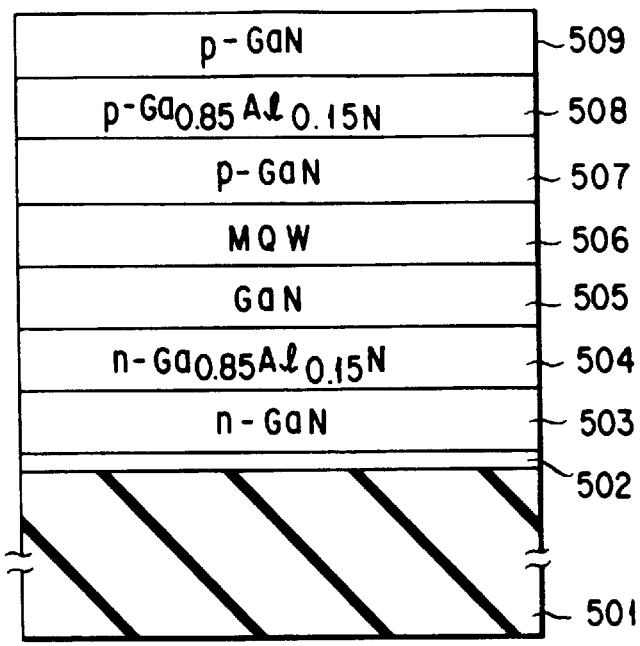
FIG. 8A is a cross-sectional view illustrating a step of fabricating a laser diode (LD) according to a second embodiment of the present invention.
Figure 8B:
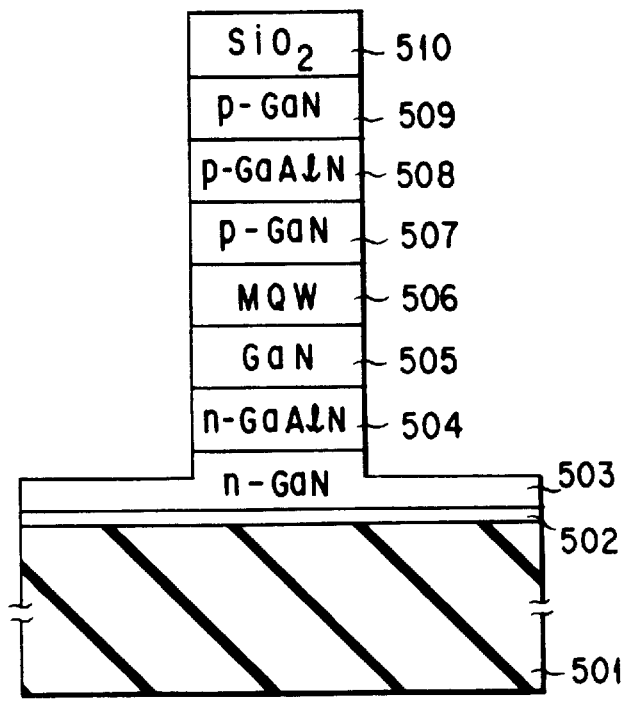
FIG. 8B is a cross-sectional view illustrating a step of fabricating the LD according to the second embodiment.

Then, the condition for etching was determined on the basis of the distance between the uppermost surface observed by a cross-sectional electron microscope and the n-type GaN layer 503, and a portion of the wafer was etched away by RIE down to the Si-containing n-type GaN layer 503, with an $SiO_2$ film 510 used as a mask, as shown in FIG. 8B.

Subsequently, the region etched away by the RIE was filled with polyimide 511. The the entire wafer was etched to expose the surface of the p-GaN layer (FIG. 8C). With an $SiO_2$ film 512 used as a mask, a part of the wafer was etched away by RIE to the Si-containing n-type GaN layer 503 (FIG. 8D).

In this state, an n-type electrode of an Ti—Al alloy was formed. After the $SiO_2$ film 512 was removed, a p-type electrode of an Ni—Au alloy was formed. It was confirmed that excellent n-type and p-type ohmic contacts were achieved without performing special heat treatment.

In the above-described laser diode, the GaN underlayer 503 is 4 $\mu$m thick. The $Ga_{1-x}Al_xN$ layer 508 is admixed with Mg, and the value x is 0.15 and the thickness thereof is 0.3 $\mu$m. Formula (4) is applicable to the relationship between the GaN underlayer 503 and the $Ga_{1-x}Al_xN$ layer 508. From the measurement result of Mg concentration by the secondary ion mass spectrometry, it was found that $N_{Mg}$ was $1.2 \times 10^{19}$ $cm^{-3}$ and the value of $N_{bg1}$ was equal to a background level ($1.0 \times 10^{16}$ $cm^{-3}$).

Thus, according to formula (4), the condition of formation of a hole observed by a scanning electron microscope is $4/(1600 \times 0.15) = 0.0167$ $\mu$m, which is lower than the value of $d_2$, i.e. 0.3 $\mu$m. Since $N_{Mg} > N_{bg1}$, N is $1.2 \times 10^{19} - 1.0 \times 10^{16} =$ about $1.2 \times 10^{19}$. The condition of formation of a crack according to formula (4) is $3.6 \times 10^{-3} \times [\log(1.2 \times 10^{19})]/(0.15 + 0.02) + 0.02 = 0.42$ $\mu$m, which is lower than the value of $d_2$, i.e. 0.3 $\mu$m.

On the other hand, the GaN underlayer 503 is 4 $\mu$m thick. The $Ga_{1-x}Al_xN$ layer 504 is admixed with Si, and the value x is 0.15 and the thickness thereof is 0.3 $\mu$m. Formula (5) is applicable to the relationship between the GaN underlayer 503 and the $Ga_{1-x}Al_xN$ layer 504. From the measurement result of Si concentration by the secondary ion mass spectrometry, it was found that $N_{si}$ was $3.6 \times 10^{18}$ $cm^{-3}$ and the value of $N_{bg2}$ was equal to a background level ($3.0 \times 10^{17}$ $cm^{-3}$).

Thus, according to formula (5), the condition of formation of a hole observed by a scanning electron microscope is $4/(1600 \times 0.15) = 0.0167$ $\mu$m, which is lower than the value of $d_2$, i.e. 0.3 $\mu$m. Since $N_{si} > N_{bg2}$, N' is $3.6 \times 10^{18} - 3.0 \times 10^{17} = 3.3 \times 10^{18}$. The condition of formation of a crack according to formula (5) is $3.2 \times 10^{-3} \times [\log(3.3 \times 10^{18})]/(0.15 + 0.02) + 0.02 = 0.37$ $\mu$m, which is lower than the value of $d_2$, i.e. 0.3 $\mu$m.

The characteristics of the fabricated blue laser diode were examined. With a voltage of 5.0V, a current of 75 mA was caused to flow and continuous oscillation was carried out.

The test of continuous oscillation was continued in this state, and the life of the device was measured until the oscillation was stopped. In this test, 200 devices in total were subjected to tests for life. Of the 200 devices, 132 had the life time of 1000 hours.

On the other hand, in the case where the method of the present invention was not applied, only one of many laser devices fabricated on one sapphire substrate could oscillate continuously. This one laser oscillated continuously at room temperature with a voltage of 7V and a current of 90 mA. The life, however, was less than 1 hour. It was confirmed that the blue laser diode fabricated in this embodiment was remarkably improved as compared with conventional devices.

According to the semiconductor device of the second embodiment of the invention, the kind of additive in each layer, the concentration of additive and the thickness of each layer were controlled so as to meet the formulae (4) and (5). Therefore, the operational voltage and current for continuous oscillation of the laser at room temperature can be reduced, and the life of the device can be remarkably increased.

(Third Embodiment)

In a third embodiment of the invention, another blue laser diode was fabricated so that the above-described formulae (4) and (5) could be satisfied. The characteristics of the diode were examined. The blue laser diode was fabricated by using the metal organic CVD apparatus shown in FIG. 1.

FIGS. 9A, 9B, 9C and 9D are cross-sectional views illustrating the steps of fabricating the laser diode according to the third embodiment of the invention.

Figure 9A:
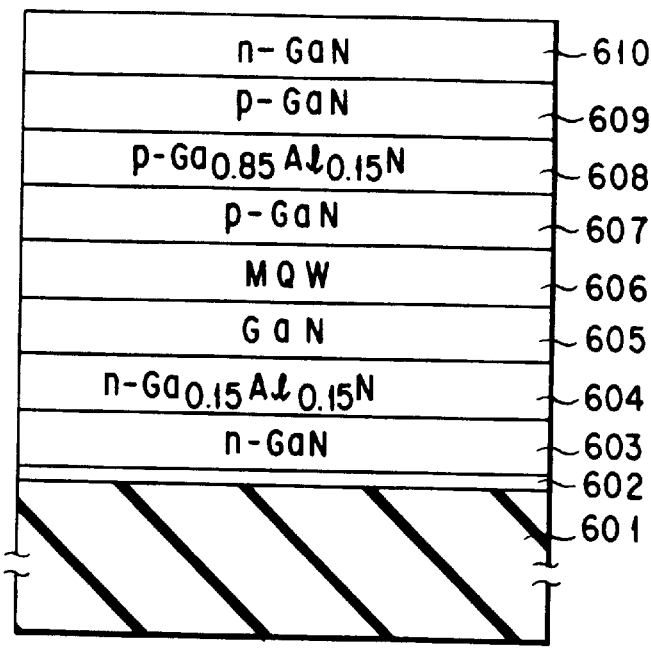
FIG. 9A is a cross-sectional view illustrating a step of fabricating a laser diode (LD) according to a third embodiment of the present invention.

In FIG. 9A, the steps up to the formation of p-type GaN layer 609 are the same as those up to the formation of p-type GaN layer 509 in the second embodiment shown in FIG. BA. After the p-type GaN layer 609 was grown, $Cp_2Mg$ was replaced with silane gas and an n-type GaN layer 610 was grown to a thickness of 0.2 $\mu$m.

Then the supply of TMG and silane gas was stopped and power to the radio-frequency heating device 305 was stopped. When the temperature decreased to 850° C., the supply of ammonia was stopped.

The wafer was taken out of the growth vessel 301 and inspected by the naked eye, and it was found that the wafer has a mirror surface. No characteristic surface pattern was observed even by means of a differential interference microscope. Specifically, no crack was observed on the wafer surface. The surface condition of the wafer was observed by a scanning electron microscope and it was found that the surface was flat and there was no characteristic pattern such as a hole, a projection or a curve.

Figure 9B:
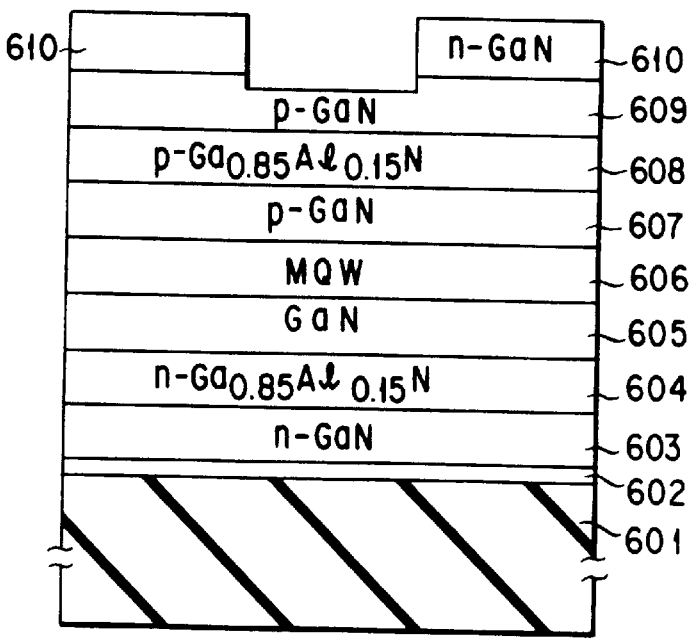
FIG. 9B is a cross-sectional view illustrating a step of fabricating the LD according to the third embodiment.

Then, the condition for etching was determined on the basis of the distance between the uppermost surface observed by a cross-sectional electron microscope and the p-type GaN layer 609, and a portion of the wafer was etched away by RIE down to the Si-containing p-type GaN layer 609, with an $SiO_2$ film used as a mask (FIG. 9B).

Figure 9C:
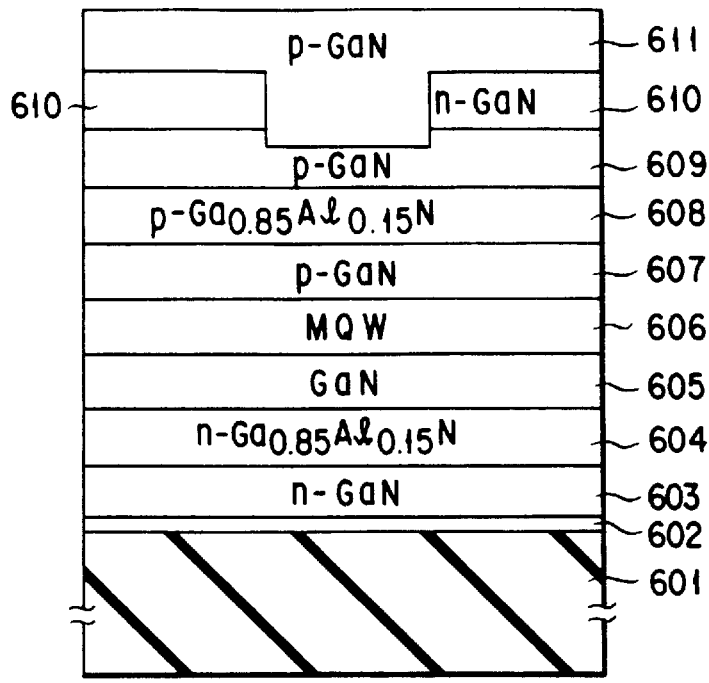
FIG. 9C is a cross-sectional view illustrating a step of fabricating the LD according to the third embodiment.

Subsequently, the wafer was put in the growth vessel 301 once again, and the temperature was raised to 1200° C. while ammonia gas was being supplied. When the temperature reached 1200° C., the supply of TMG and $Cp_2Mg$ was started and a p-GaN layer 611 was grown to a thickness of 1 $\mu$m (FIG. 9C). Then, the supply of TMG and silane gas was stopped and power to the radio-frequency heating device 305 was stopped. When the temperature fell to 850° C., the supply of ammonia was stopped.

Figure 9D:
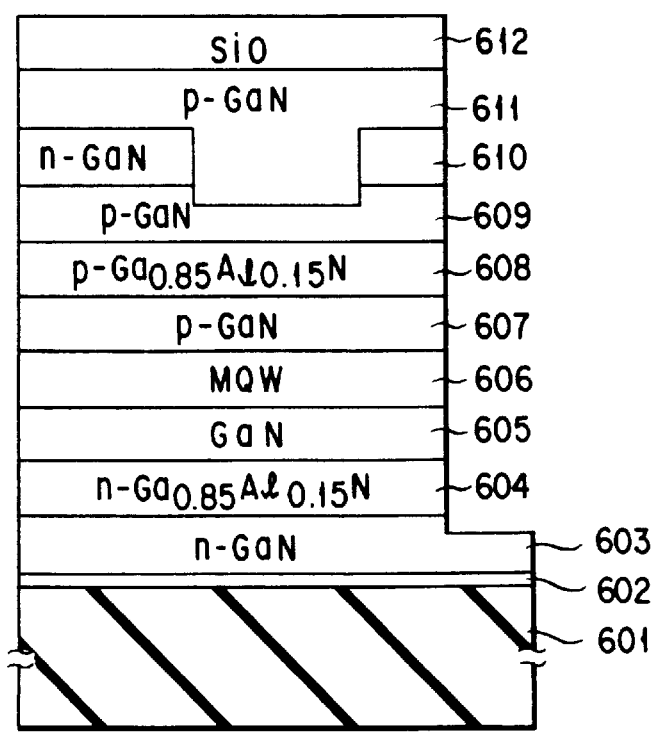
FIG. 9D is a cross-sectional view illustrating a step of fabricating the LD according to the third embodiment.

With an $SiO_2$ film 612 used as a mask, a part of the wafer was etched away by RIE to the Si-containing n-type GaN layer 603 (FIG. 9D).

In this state, an n-type electrode of an Ti—Al alloy was formed. After the $SiO_2$ film 612 was removed, a p-type electrode of an Ni—Au alloy was formed. It was confirmed that excellent n-type and p-type ohmic contacts were achieved without performing special heat treatment.

In the above-described laser diode, the GaN underlayer 603 is 4 $\mu$m thick. The $Ga_{1-x}Al_xN$ layer 608 is admixed with Mg, and the value x is 0.15 and the thickness thereof is 0.3 $\mu$m. Formula (4) is applicable to the relationship between the GaN underlayer 603 and the $Ga_{1-x}Al_xN$ layer 608. From the measurement result of Mg concentration by the secondary ion mass spectrometry, it was found that $N_{Mg}$ in formula (4) was 1.2×10$^{19}$ cm$^{-3}$ and the value of $N_{bg1}$ was equal to a background level (1.0×10$^{16}$ cm$^{-3}$).

Thus, according to formula (4), the condition of formation of a hole observed by a scanning electron microscope is 4/(1600×0.15)=0.0167 $\mu$m, which is lower than the value of $d_2$, i.e. 0.3 $\mu$m. Since $N_{Mg}>N_{bg1}$, N is 1.2×10$^{19}$×1.0×10$^{18}$. The condition of formation of a crack according to formula (4) is 3.6×10$^{-3}$×[log(1.2×10$^{19}$)]/(0.15+0.02)+0.02=0.42 $\mu$m, which is lower than the value of $d_2$, i.e. 0.3 $\mu$m.

On the other hand, the GaN underlayer 603 is 4 $\mu$m thick. The $Ga_{1-x}Al_xN$ layer 604 is admixed with Si, and the value x is 0.15 and the thickness thereof is 0.3 $\mu$m. Formula (5) is applicable to the relationship between the GaN underlayer 503 and the $Ga_{1-x}Al_xN$ layer 504. From the measurement result of Si concentration by the secondary ion mass spectrometry, it was found that $N_{si}$ was 3.6×10$^{18}$ cm$^{-3}$ and the value of $N_{bg2}$ was equal to a background level (3.0×10$^{17}$ cm$^{-3}$).

Thus, according to formula (5), the condition of formation of a hole observed by a scanning electron microscope is 4/(1600×0.15)=0.0167 $\mu$m, which is lower than the value of $d_2$, i.e. 0.3 $\mu$m. Since $N_{si}>N_{bg2}$, N' is 3.6×10$^{17}$–3.0×10$^{18}$=3.3×10$^{18}$. The condition of formation of a crack according to formula (5) is 3.2×10$^{-3}$×[log(3.3×10$^{18}$)]/(0.15+0.02)+0.02=0.37 $\mu$m, which is lower than the value of $d_2$, i.e. 0.3 $\mu$m.

Like the second embodiment, The characteristics and life of the fabricated blue laser diode were examined. The operational voltage was 5.0V. Thus, substantially the same result as with the second embodiment was obtained.

According to the semiconductor device of the third embodiment of the invention, the kind of additive in each layer, the concentration of additive and the thickness of each layer were controlled so as to meet the formulae (4) and (5). Therefore, substantially the same advantages as with the second embodiment were obtained.

(Fourth Embodiment)

In a fourth embodiment of the invention, an additive-free GaN layer was interposed between the buffer layer 402 (502, 602) and n-type GaN layer 403 (503, 603) in each of the structures shown in FIGS. 7A, 7B and 7C of the first to third embodiments. The characteristics of these devices were examined, as has been described above.

As a result, it was found that the characteristics were generally uninfluenced. However, the uppermost surfaces of the grown structures have a higher quality of mirror surface and a higher flatness, as compared to the case where the additive-free GaN layer was not interposed.

According to the semiconductor device of the present embodiment, the additive-free GaN layers were provided in the structures of the first to third embodiments. Thus, the same advantages as with the first to third embodiments can be obtained, the quality of the mirror surface of each device enhanced, and the flatness increased.

Accordingly, the interposition of the additive-free GaN layer is desirable in enhancing the characteristics of the semiconductor devices.

In the first and third embodiments, some examples of the n-type and p-type ohmic electrode materials were shown. The electrode structure in the present invention is not limited to these examples. Various electrode structures may be adopted if similar or better ohmic properties are exhibited by electrode materials and heat treatment methods.

In the first to third embodiments, the invention is applied to the light-emitting devices satisfying the conditions of formulae (4) and (5). These conditions, however, are applicable to all kinds of GaN-based semiconductor devices for which prevention of cracks or holes is required. Accordingly, the present invention can be applied to various devices without departing from the spirit of the invention. For example, the invention is optimally applicable to processes of fabricating high-frequency field effect transistors which are operable at 1 GHz or above with a wide bandgap made use of, or very-high-speed electron mobility transistors with use of a two-dimensional electron gas.

(Fifth Embodiment)

In a fifth embodiment of the invention, the thickness of an Si-doped AlGaN cladding layer and the thickness of an Mg-doped AlGaN cladding layer are controlled in a nitride-based semiconductor device formed on a substrate such as a sapphire substrate. Thus, the formation of a crack is prevented due to the Mg dopant, without affecting the light confining effect of the laser.

Specifically, an Mg-doped AlGaN layer is made thicker than an n-type or an undoped type AlGaN layer. In this case, the thickness and composition of each optical guide layer provided between an active layer and the cladding layers are adjusted so as to correct optical asymmetry in the cladding layers.

Figure 10:
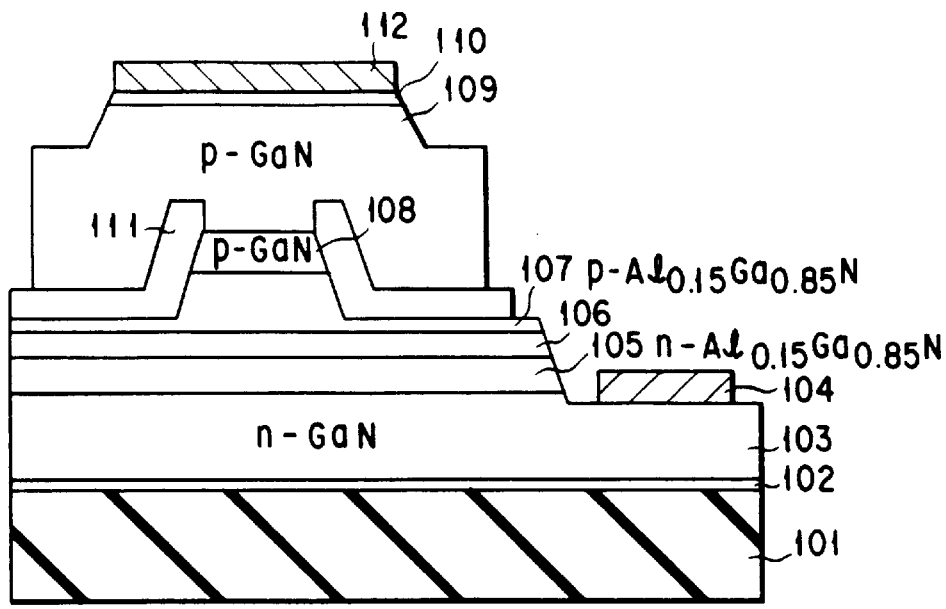
FIG. 10 schematically shows the structure of a blue laser apparatus according to a fifth embodiment of the present invention.

FIG. 10 schematically shows the structure of a blue semiconductor laser device according to a fifth embodiment of the invention.

Each of nitride layers was grown by MOCVD (Metal Organic Chemical Vapor Phase Deposition).

In this blue semiconductor laser device, a GaN buffer layer 102 (0.03 $\mu$m thick) is provided on a sapphire substrate 101 by low-temperature growth (550° C.). On the resultant structure, an n-GaN contact layer 103 (doped with Si; $5 \times 10^{18}$ cm$^{-3}$; 3 $\mu$m) formed by high-temperature growth (1100° C.), an n-type electrode 104 formed of Al/Ni/Au, a cladding layer 105 of n-Al$_{0.15}$Ga$_{0.85}$N (doped with Si; $5 \times 10^{18}$ cm$^{-3}$; 0.25 $\mu$m) and an active layer 106 including multi-quantum wells (MQW) and optical guide layers are successively laminated.

Figure 11:
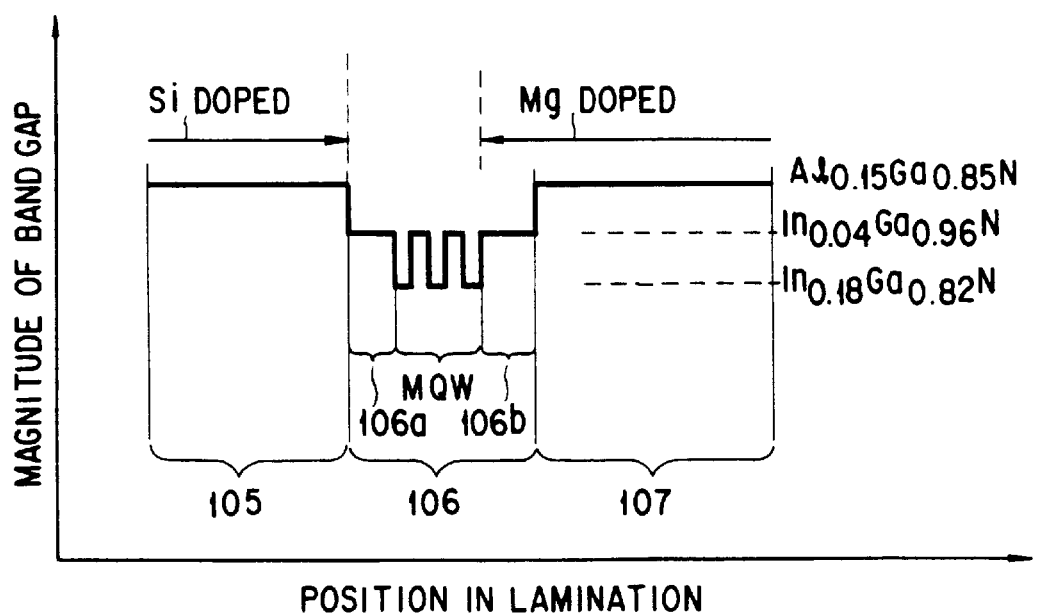
FIG. 11 is a band diagram showing conduction-band-side band gaps of an n-AlGaN cladding layer, an active layer and a p-AlGaN cladding layer in the laser according to the fifth embodiment of the invention.

As is shown in FIG. 11 in detail, the active layer 106 includes optical guide layers 106a and 106b each formed of GaN with a thickness of 0.1 $\mu$m. Each well layer is formed of In$_{0.18}$Ga$_{0.82}$N$_3$ with a thickness of 3 nm, and each barrier layer is formed of In$_{0.04}$Ga$_{0.96}$N with a thickness of 5 nm.

In the blue semiconductor laser apparatus, a p-Al$_{0.15}$Ga$_{0.85}$N cladding layer 107 (doped with Mg; $5 \times 10^{19}$ cm$^{-3}$; 0.35 $\mu$m) is provided on the active layer 106. In addition, a p-GaN re-growth cap layer 108 (doped with Mg; $5 \times 10^{19}$ cm$^{-3}$; 0.3 $\mu$m), a p-GaN contact layer 109 (doped with Mg; $8 \times 10^{19}$ cm$^{-3}$; 0.8 $\mu$m), a p$^+$-GaN high-concentration contact layer 110 (doped with Mg; $2 \times 10^{20}$ cm$^{-3}$; 0.1 $\mu$m), a current restriction layer 111 (doped with Si; $5 \times 10^{18}$ cm$^{-3}$; 0.25 $\mu$m), and a p-type electrode 112 are provided successively.

The sapphire substrate has a (0001)c plane and a laser mirror is formed by a cleavage.

As has been described above in connection with the prior art, a hexagonal crack tends to easily form in the AlGaN layer with high Al composition. Unless such a crack is prevented, the laser structure does not oscillate. Although operable laser devices were obtained at a low yield, the oscillation characteristics were considerably degraded in the turn-on state, which was considered to result from a residual strain. If the thickness of the AlGaN cladding layer is simply decreased in order to suppress the formation of a crack, the waveguide mode will become unstable and waveguide mode light leaking from the cladding will be lost in a GaN contact layer. Thus, a laser with a low threshold cannot be obtained.

As mentioned above, the inventors found that the Mg-doped AlGaN layer could be grown thicker than the undoped or si-doped n-type AlGaN layer, without formation of a crack. The reason why the thickness of the AlGaN layer can be increased by 20% to 50% was set forth above, and the conditions under which no crack or hole forms were expressed by the formulae (1) to (5) wherein the thickness of each layer and the concentration of additive were used as parameters.

In the laser apparatus shown in FIG. 10, the crack prevention effect by virtue of Mg is positively adopted, and the conditions of formulae (4) and (5) are satisfied.

FIG. 11 is a band diagram showing conduction-band-side band gaps of the n-AlGaN cladding layer, active layer and p-AlGaN cladding layer in the laser according to the fifth embodiment of the invention.

The thickness of the Si—AlGaN layer 105 in which a crack tends to form is 0.25 $\mu$m and small, while the Mg—AlGaN layer 107 functioning as p-type cladding layer is 0.35 $\mu$m and great. In this combination, the total thickness of the Al-containing layers is less than the critical thickness of formation of a crack. Although the Al-containing layers are asymmetrical with respect to the optical waveguide mode, the threshold value does not increase greatly. Inversely, when the thickness of the Mg—AlGaN layer 107 was decreased to 0.25 $\mu$m, the threshold value increased by 50%.

The laser of this embodiment continuously oscillated at room temperature at a threshold of 85 mA. The oscillation wavelength was 415 nm and the operation voltage was 6V. In FIG. 10, the current restriction layer 111 is an n-type InGaN layer and has such a composition that light of light emission wavelength may be lost. Specifically, this laser is a loss guide type lateral mode control laser and the stripe width is set at 4 $\mu$m. The InGaN layer is grown in a low temperature range of 700 to 900° C. A mask of, e.g. SiO$_2$ is left on the p-GaN re-growth cap layer 108. When the current restriction layer 111 is re-grown, it is selectively grown, thereby opening a window. The p-GaN contact layer 109, too, is re-grown after the SiO$_2$ mask is removed. The Mg concentration is particularly increased in the p$^+$-GaN high-concentration contact layer 110 so that the layer 110 may well function as a contact layer.

As has been described above, according to the semiconductor laser device of the present embodiment, the amount of additive such as Mg in each layer and the thickness of each layer are controlled within the ranges for meeting predetermined conditions. Thus, the AlGaN layer with high Al concentration can be used as a cladding layer in the nitride-based semiconductor device without formation of a crack. The device resistance can be fully decreased. In particular, in the semiconductor laser, the threshold can be decreased, the reliability enhanced, and the manufacturing method simplified. This semiconductor device is very useful.

(Sixth Embodiment)

In a sixth embodiment of the invention, the composition of an Si-doped AlGaN cladding layer and that of an Mg-doped AlGaN cladding layer are controlled in a nitride-based semiconductor device formed on a substrate such as a sapphire substrate. Thus, the formation of a crack is prevented due to the Mg dopant, without affecting the light confining effect of the laser.

Specifically, the Al composition of an Mg-doped AlGaN layer is made higher than that of an n-type or an undoped type AlGaN layer. In this case, the thickness and composition of each optical guide layer provided between an active layer and the cladding layers are adjusted so as to correct optical asymmetry in the cladding layers.

FIG. 12 shows a band diagram showing conduction-band-side band gaps according to the sixth embodiment of the invention.

The device of the sixth embodiment has the laser structure shown in FIG. 10. In this embodiment, the Al composition in the Si—AlGaN layer in which a crack tends to form is decreased to 10%. The thickness of the Si—AlGaN layer 105 or the n-type cladding layer is set at 0.35 µm which is equal to the thickness of the p-type Mg—AlGaN layer 107. The conditions of formulae (4) and (5) are satisfied.

In this combinational structure, no crack formed. Although the cladding layers are asymmetric with respect to the optical waveguide mode, the threshold does not increase greatly. The laser of this embodiment continuously oscillated at room temperature at a threshold of 75 mA with p-side down bonding configuration. The oscillation wavelength was 415 nm and the operation voltage was 5.5V.

As has been described above, according to the semiconductor laser device of the present embodiment, the amount of additive such as Mg in each layer and the thickness of each layer are controlled within the ranges for meeting predetermined conditions. Thus, the same advantages as in the fifth embodiment can be obtained.

(Seventh Embodiment)

In a seventh embodiment of the invention, the thickness of an Si-doped AlGaN cladding layer and the thickness of an Mg-doped AlGaN cladding layer are controlled in a nitride-based semiconductor device formed on a substrate such as a sapphire substrate. Thus, the formation of a crack is prevented due to the Mg dopant, without affecting the light confining effect of the laser.

Specifically, an Mg-doped AlGaN layer is made thicker than an n-type or an undoped type AlGaN layer. In this case, the thickness and composition of each optical guide layer provided between an active layer and the cladding layers are adjusted so as to correct optical asymmetry in the cladding layers.

FIG. 13 shows a band diagram showing conduction-band-side band gaps according to the seventh embodiment of the invention.

The device of the sixth embodiment has the laser structure mainly shown in FIG. 10. Like the fifth embodiment, the thickness of the Si—AlGaN layer 105 in which a crack tends to form is 0.25 µm and small, while the Mg—AlGaN layer 107 functioning as p-type cladding layer is 0.35 µm and great.

The influence of asymmetry with respect to the optical waveguide mode is reduced by using a devised optical guide layer. Specifically, as shown in FIG. 13, an optical guide layer 106a having a thickness of 0.1 µm constitutes an n-side portion of the active layer 106, while an MQW put in direct contact with the Mg—AlGaN layer 103 constitutes a p-side portion of the active layer 106. Since the n-side cladding layer 105 is thinned, an optical waveguide mode loss occurs and the optical mode is deviated to the p-side. However, the n-side guide layer 106a compensates the optical mode.

The laser fabricated in this embodiment continuously oscillated at room temperature at a threshold of 65 mA. The oscillation wavelength was 415 nm and the operational voltage was 5V.

As has been described above, according to the semiconductor laser device of the present embodiment, the amount of additive such as Mg in each layer and the thickness of each layer are controlled within the ranges for meeting predetermined conditions. Thus, the same advantages as in the fifth embodiment can be obtained. In addition, the optical asymmetry can be exactly eliminated by adjusting the thickness of the optical guide layer.

In this embodiment, the MQW is put in direct contact with the Mg—AlGaN layer 107. However, it is possible to interpose an optical guide layer there-between and correct the asymmetry by adjusting the thickness of each of the optical guide layers provided on both sides of the MQW. Furthermore, the asymmetry may be corrected by adjusting the composition of the optical guide layer.

(Eighth Embodiment)

In an eighth embodiment of the invention, the composition of an Si-doped AlGaN cladding layer and that of an Mg-doped AlGaN cladding layer are controlled in a nitride-based semiconductor device formed on a substrate such as a sapphire substrate. Thus, the formation of a crack is prevented due to the Mg dopant, without affecting the light confining effect of the laser.

Specifically, Mg with an impurity concentration of $1 \times 10^{19}$ cm$^{-3}$ or more, in addition to n-type impurities, is simultaneously doped in an AlGaN of the n-type in which a crack tends to easily form. Thereby the formation of a crack is prevented. In this case, if optical asymmetry occurs in cladding layers, the asymmetry is corrected by adjusting the thickness and composition of each optical guide layer provided between the active layer and the cladding layers.

FIG. 14 schematically shows the structure of a blue semiconductor laser apparatus according to the eighth embodiment of the present invention.

Each of nitride layers was grown by MOCVD (Metal Organic Chemical Vapor Phase Deposition).

In this blue semiconductor laser device, a GaN buffer layer 204 (0.03 µm thick) is provided on a sapphire substrate 203 by low-temperature growth (550° C.). On the resultant structure, an n-GaN contact layer 205 (doped with Si; $5 \times 10^{18}$ cm$^{-3}$; 3 µm) formed by high-temperature growth (1100° C.), an n-side electrode 206 formed of Ti/Au, a cladding layer 207 of n-Al$_{0.15}$Ga$_{0.85}$N (doped with Mg of $5 \times 10^{19}$ cm$^{-3}$ and simultaneously with Si of $5 \times 10^{18}$ cm$^{-3}$; 0.35 µm) and an active layer 208 including multi-quantum wells (MQW) and optical guide layers are successively laminated.

As is shown in FIG. 15 in detail, the active layer 208 includes optical guide layers 208a and 208b each formed of GaN with a thickens of 0.1 µm. Each well layer is formed of In$_{0.18}$Ga$_{0.82}$N$_3$ with a thickness of 3 nm, and each barrier layer is formed of In$_{0.04}$Ga$_{0.96}$N with a thickness of 5 nm.

In the blue semiconductor laser apparatus, a p-Al$_{0.15}$Ga$_{0.85}$N cladding layer 209 (doped with Mg; $5 \times 10^{19}$ cm$^{-3}$; 0.35 µm) is provided on the active layer 208. In addition, a p-GaN re-growth cap layer 210 (doped with Mg; $5 \times 10^{19}$ cm$^{-3}$; 0.3 µm), a p-GaN contact layer 109 (doped with Mg; $8 \times 10^{19}$ cm$^{-3}$; 0.8 µm), a p$^{+}$-GaN high-concentration contact layer 212 (doped with Mg; $2 \times 10^{20}$ cm$^{-3}$; 0.1 µm), a p-side electrode 213, and a buried layer 214 of high-resistance Al$_{0.6}$Ga$_{0.4}$N (undoped; 0.25 µm) are provided successively.

The sapphire substrate has a (0001)c plane and a laser mirror is formed by a cleavage.

In FIG. 14, the buried layer 214 is formed of high-resistance AlGaN. It was formed by selective growth after the etching to the active layer was carried out. This buried layer 214 has a so-called BH structure, and a stripe width thereof is 3 µm. If the Al composition is high, the AlGaN has a high resistance even if no impurities are doped. However, Zn may be doped. Alternatively, Zn-doped GaN may be used.

FIG. 15 is a band diagram showing conduction-band-side band gaps according to the eighth embodiment.

In this embodiment, Mg is simultaneously doped in the Si—AlGaN layer 207 in which a crack tends to easily form. The thickness of the Si—AlGaN layer 207 is 0.35 µm and equal to that of the p-side Mg—AlGaN cladding layer 209. In this combinational structure, no crack formed. In this structure, Mg functions as crack control impurities. As has been described above, the Si—AlGaN layer 207 is doped with Mg in an amount of $5\times10^{19}$ cm$^{-3}$ and Si in an amount of $5\times10^{18}$ cm$^{-3}$. Since the impurity level of Mg is about 150 mev and deep, the Si—AlGaN layer 207 is activated at room temperature. The layer 207 is of n-type due to compensation with p-type and n-type impurities. The optical loss and the influence of n-carrier concentration due to simultaneous doping of Mg are low.

The laser fabricated in this embodiment continuously oscillated at room temperature at a threshold of 75 mA. The oscillation wavelength was 415 nm and the operational voltage was 5.5V.

As has been described above, according to the semiconductor laser device of the present embodiment, the amount of additive such as Mg in each layer and the thickness of each layer are controlled within the ranges for meeting predetermined conditions. Thus, the same advantages as in the fifth embodiment can be obtained.

(Ninth Embodiment)

In the first to eighth embodiments, formation of a crack in the AlGaN is prevented by meeting the conditions in formulae (4) and (5). On the other hand, in a ninth embodiment of the invention, the total thickness of AlGaN layers is set to more than half of the thickness of all epitaxial layers so that the lattice constant of the AlGaN layers becomes dominant in the layer structure. Thereby the formation of a crack in the AlGaN layers due to lattice mismatching resulting from introduction of Al can be prevented. In other words, the AlGaN layer is formed as a major layer in the layer structure.

Figure 16:
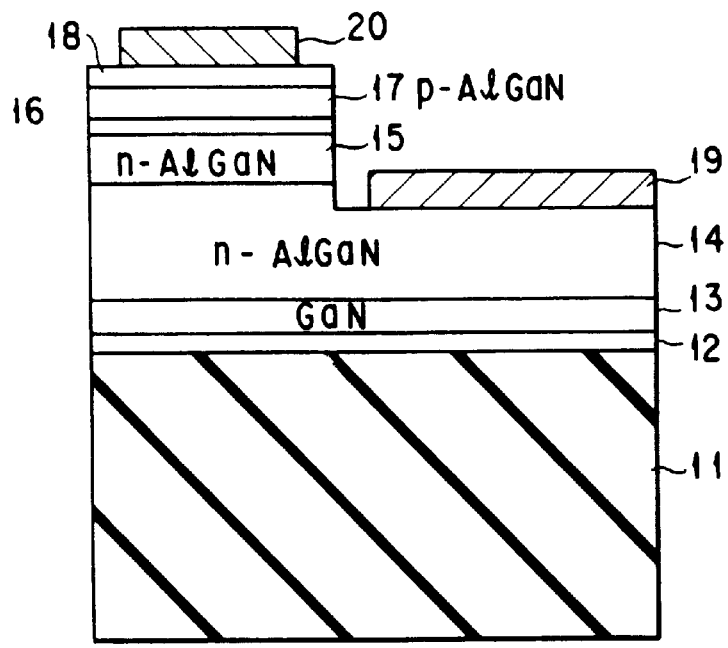
FIG. 16 is a cross-sectional view schematically showing the structure of a blue semiconductor laser apparatus to which a nitrogen-containing compound semiconductor device according to a ninth embodiment of the invention is applied.

FIG. 16 is a cross-sectional view schematically showing the structure of a blue semiconductor laser apparatus to which a nitrogen-containing compound semiconductor device according to the ninth embodiment of the invention is applied.

Each of nitride layers in the blue semiconductor laser apparatus was grown by MOCVD (Metal Organic Chemical Vapor Phase Deposition).

In FIG. 16, a GaN buffer layer 12 (0.03 µm) is provided on a sapphire substrate 11 by low-temperature growth (550° C.). Then a GaN single crystal buffer layer 13 (0.3 µm) is grown at a high temperature (1100° C.).

On the resultant structure, a sufficiently thick contact layer 14 of n-$Al_{0.15}Ga_{0.85}N$ (doped with Si; $1\times10^{18}$ cm$^{-3}$; 1.5 µm), a cladding layer 15 of n-$Al_{0.3}Ga_{0.3}N$ (doped with Si; $5\times10^{17}$ cm$^{-3}$; 0.2 µm), an active layer 16, a cladding layer 17 of p-$Al_{0.3}Ga_{0.3}N$ (doped with Mg; $5\times10^{17}$ cm$^{-3}$; 0.2 µm), and a GaN contact layer 18 (doped with Mg; $1-3\times10^{18}$ cm$^{-3}$, 0.1 µm) are successively laminated.

A p-side electrode 20 is provided on the GaN contact layer 18, and an n-side electrode 19 is provided on the n-AlGaN contact layer 14. Thus, the blue semiconductor laser apparatus is constituted. The active layer 16 has a structure (undoped) in which an $In_{0.1}Ga_{0.9}N$ layer 100 Å thick is sandwiched by $Al_{0.1}Ga_{0.9}N$ layers.

In the blue semiconductor laser apparatus shown in FIG. 16, the semiconductor device portion comprises as major GaN layers the GaN buffer layer 12 formed by low-temperature growth, GaN single crystal buffer layer 13 formed by high-temperature growth, and GaN contact layer 18. The total thickness of the GaN layers is about 0.43 µm. The semiconductor device portion comprises as major AlGaN layers the n-AlGaN contact layer 14, n-AlGaN cladding layer 15, active layer 16 and p-AlGaN cladding layer 17. The total thickness of these AlGaN layers is about 1.9 µm.

In the structure of this embodiment, the total thickness of the AlGaN layers is greater than that of the GaN layers. Thus, the AlGaN layers have the dominant lattice constant in the layer structure.

Figure 17:
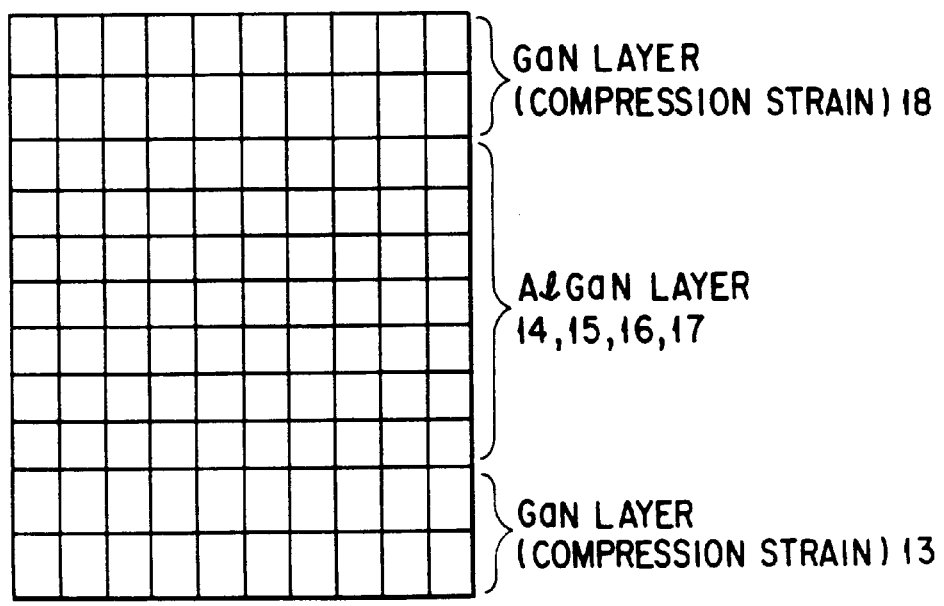
FIG. 17 illustrates the state in which formation of cracks is prevented in the compound semiconductor device according to the ninth embodiment.

FIG. 17 is a conceptual view illustrating this feature. Each GaN layer has a less than a critical film thickness at which a crack will not form. Although a compression strain is caused in the GaN layer, the layer structure can be formed and maintained without a dislocation.

Figure 18:
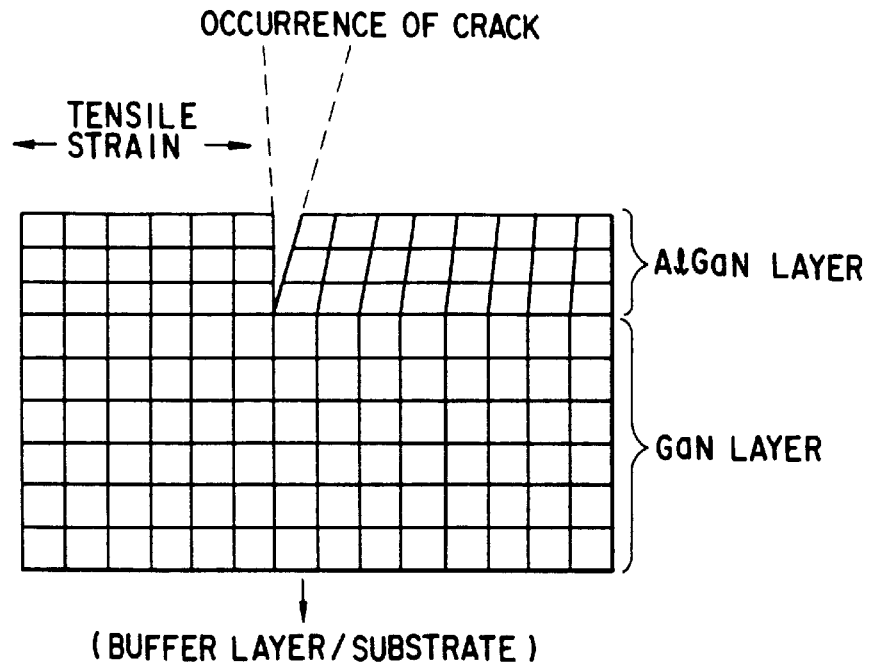
FIG. 18 illustrates the state in which a crack is made in an AlGaN layer by tensile strain.

If, unlike this embodiment, the AlGaN layers are not formed as major layers in the layer structure and the conditions in formulae (4) and (5) are not satisfied, a tensile strain occurs in the AlGaN layer and a crack forms, as shown in the conceptual figure of FIG. 18.

When an AlGaN layer is formed by using a sapphire substrate, a single crystal GaN layer needs to be provided in direct contact with, or adjacent to, the substrate, as in the present embodiment. As compared to an Al-containing nitride crystal, a GaN crystal has higher toughness. Thus, the presence of the GaN layer can maintain crystal growth even if a strain occurs between the AlGaN layer and the substrate or a low-temperature growth layer to be described below. In general, it is difficult to continue the growth of a high-quality AlGaN layer on the sapphire substrate without interposing a GaN layer therebetween.

As has been described above, the high-temperature growth GaN single-crystal buffer layer 13 is provided to reduce lattice mismatching between the AlGaN layer and the sapphire substrate 11 or low-temperature growth GaN buffer layer 12 which is an amorphous layer. In order to achieve this object, the buffer layer 13 is a single crystal layer with a thickness less than a critical film thickness.

The high-temperature growth GaN single-crystal buffer layer 13, as described above, prevents dislocations from propagating to the n-AlGaN contact layer 14 and subsequently formed layers and suppresses occurrence of dislocations due to the compression strain after the semiconductor device is fabricated. If the high-temperature GaN single-crystal buffer layer 13 is not provided, a dislocation, etc. occurs in the low-temperature growth GaN buffer layer 12 or amorphous layer due to a compression strain caused in the AlGaN layer of the fabricated semiconductor device. Such a dislocation propagates upward and at last a dislocation will occur in the AlGaN layers including the light-emission region. According to this embodiment, the high-temperature growth GaN single-crystal buffer layer 13 prevents the occurrence and propagation of dislocations.

Since the high-temperature growth GaN single-crystal buffer layer 13 itself has a thickness less than the critical film thickness, as mentioned above, a dislocation or a crack does not occur therein.

The low-temperature growth amorphous GaN buffer layer 12 is provided at an interface between the sapphire substrate 11 and the AlGaN single-crystal buffer layer 13. The buffer layer 12 may be replaced with an amorphous layer such as a low-temperature growth AlN buffer layer. This buffer layer 12 is provided for the following reason. A low-temperature growth buffer layer, if amorphous, functions as a major layer for formation of a nucleus of a growth layer. Such a low-temperature growth buffer layer reduces lattice mismatching due to the presence of a dislocation. Accordingly, the low-temperature growth buffer layer greatly reduces the lattice mismatching with the sapphire substrate, and subsequent crystal growth can be continued in good condition.

Thus, the low-temperature growth buffer layer contributes to growth of an excellent single-crystal GaN layer. Thereby a light-emission region comprising AlGaN layers can be formed.

When the total thickness of the AlGaN layers is greater than half the total thickness of all epitaxial layers, the AlGaN layers with a major total thickness in the layer structure have a dominant lattice constant in the layer structure, and the excellent crystal condition can be maintained. The AlGaN layers need to have a certain thickness in order to confine light. The AlGaN layers can have such a thickness since the total thickness of the GaN layers can be reduced by optimizing the carrier concentration in the contact layer, etc.

The characteristics of the contact layer were evaluated. A decrease in contact resistance, which is possibly due to a compression strain in GaN, was found. When the Al composition in the AlGaN layer exceeded 10%, the compression strain in GaN began to be improved, as mentioned above. An oxide-based substrate formed of, e.g. sapphire contributed to create the above-mentioned lattice constant of the AlGaN layer.

The blue semiconductor laser apparatus fabricated in this embodiment continuously oscillated at room temperature at a threshold of 105 mA. The oscillation wavelength was 415 nm and the operational voltage was 10V.

In the nitrogen-containing compound semiconductor device according to the ninth embodiment of the invention, the total thickness of AlGaN layers is set to be greater than half the total thickness of the epitaxial layers so that the AlGaN layers could have the dominant lattice constant in the layer structure. Thus, excellent AlGaN layers with no crack can be obtained, and an AlGaN layer with high Al composition can be used as a cladding layer in the nitride-based semiconductor device. This device is very useful.

Accordingly, the device resistance can be sufficiently reduced. In particular, in a semiconductor laser, a low threshold value can be attained, with high operational reliability. Thereby, a nitrogen-containing compound semiconductor device with excellent characteristics, wherein light and carriers can be fully confined in the active layer, can be provided.

In addition, in the nitrogen-containing compound semiconductor device according to the present embodiment, the low-temperature growth GaN buffer layer 12 and high-temperature growth GaN single-crystal buffer layer 13 with a thickness less than a critical film thickness are provided between the sapphire substrate 11 and the n-AlGaN contact layer 14. Thereby, fundamental lattice mismatching between the substrate 11 and nitride-based semiconductor growth layer is eliminated, and a difference in lattice constant due to the fact that the AlGaN layers have the dominant lattice constant is canceled. Therefore, it is possible to prevent a dislocation or a crack from newly occurring. A compound semiconductor device with less dislocation and crack can be obtained. As a result, the device resistance can be sufficiently reduced. Since the single-crystal GaN buffer layer 13 is provided, the flatness of the crystal surface is improved and excellent growth of AlGaN layers can be achieved.

It is possible to fabricate a semiconductor light-emission device under the same conditions for the thickness of AlGaN layers as in the present embodiment, while the conditions of formulae (4) and (5) are satisfied. Thereby, a highly reliable GaN-based semiconductor device, wherein formation of a crack in AlGaN layers can be prevented more surely, can be obtained.

(Tenth Embodiment)

In the first to eighth embodiments, formation of a crack in the AlGaN is prevented by meeting the conditions in formulae (4) and (5). On the other hand, in a tenth embodiment of the invention, like the ninth embodiment, the total thickness of AlGaN layers is set to more than half of the thickness of all epitaxial layers so that the lattice constant of the AlGaN layers becomes dominant in the layer structure. Thereby the formation of a crack in the AlGaN layers due to lattice mismatching resulting from introduction of Al can be prevented. In other words, the AlGaN layer is formed as a major layer in the layer structure.

Figure 19:
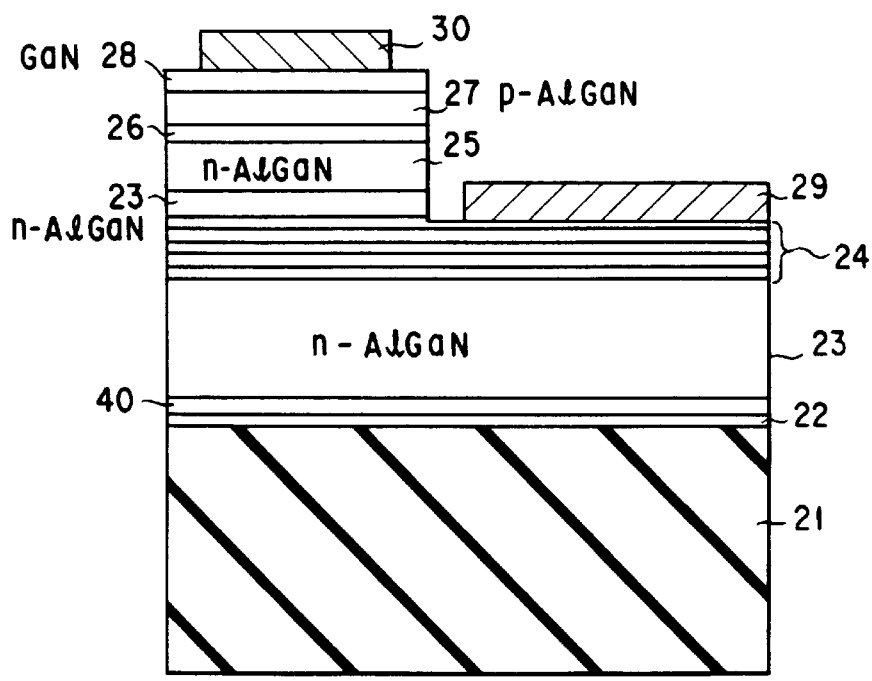
FIG. 19 is a cross-sectional view schematically showing the structure of a blue semiconductor laser apparatus to which a nitrogen-containing compound semiconductor device according to a tenth embodiment of the invention is applied.

FIG. 19 is a cross-sectional view schematically showing the structure of a blue semiconductor laser apparatus to which a nitrogen-containing compound semiconductor device according to the tenth embodiment of the invention is applied.

Each of nitride layers in the blue semiconductor laser apparatus was grown by MOCVD (Metal Organic Chemical Vapor Phase Deposition).

In FIG. 19, an AlGaN buffer layer 22 (0.03 $\mu$m) is provided on a sapphire substrate 21 by low-temperature growth (550° C.). Then a GaN single-crystal buffer layer 40 (0.3 $\mu$m) is grown at a high temperature (1100° C.).

On the resultant structure, the following layers are laminated successively: a sufficiently thick n-$Al_{0.15}Ga_{0.85}N$ layer 23 (doped with Si; $1\times10^{18}$ cm$^{-3}$; 1.5 $\mu$m); a super-lattice contact layer 24 consisting of 50 pairs of 50 Å n-GaN layers (doped with Si; $8\times10^{18}$ cm$^{-3}$) and 50 Å n-$Al_{0.15}Ga_{0.85}N$ layers (doped with Si; $5\times10^{18}$ cm$^{-3}$); a cladding layer 25 of n-$Al_{0.3}Ga_{0.3}N$ (doped with Si; $5\times10^{17}$ cm$^{-3}$; 0.2 $\mu$m); an undoped active layer 26 in which a 100 Å $In_{0.1}Ga_{0.9}N$ layer is sandwiched between $Al_{0.1}Ga_{0.9}N$ layers; a cladding layer 27 of p-$Al_{0.3}Ga_{0.3}N$ (doped with Mg; $5\times10^{17}$ cm$^{-3}$; 0.2 $\mu$m); and a GaN contact layer 28 (doped with Mg; $1-3\times10^{18}$ cm$^{-3}$; 0.1 $\mu$m). A p-side electrode 30 and an n-side electrode 30 are provided, and the blue semiconductor laser apparatus is constituted.

The GaN single-crystal buffer layer 40 is provided for the same purpose as the GaN single-crystal buffer layer 13 in the ninth embodiment. Although not described here in detail, the AlGaN buffer layer 22 grown at low temperature has the same function as the GaN buffer layer 12 grown at low temperature in the ninth embodiment.

The blue semiconductor laser apparatus fabricated in this embodiment continuously oscillated at room temperature at a threshold of 55 mA. The oscillation wavelength was 415 nm and the operational voltage was 5V.

In the nitrogen-containing compound semiconductor device according to the tenth embodiment of the invention, the super-lattice contact layer containing n-AlGaN and GaN is provided in addition to the structure similar to that of the ninth embodiment. Thus, in addition to the same advantages as with the ninth embodiment, a rise in contact resistance can be suppressed and a lower resistance can be attained.

Specifically, the height of a barrier decreases due to alloying after the formation of the electrode 29. In addition, an injected current can be transferred to the active layer at low resistance by a pseudo two-dimensional electron gas in the super-lattice.

It is possible to fabricate a semiconductor light-emission device under the same conditions for the thickness of AlGaN layers as in the present embodiment, while the conditions of formulae (4) and (5) are satisfied. Thereby, a highly reliable GaN-based semiconductor device, wherein formation of a crack in AlGaN layers can be prevented more surely, can be obtained.

In the first to tenth embodiments, a sapphire layer is used as a substrate. However, substrates of the following materials can be used: barium oxide (BaO), zinc oxide (ZnO), silicon carbide (SiC), spinel, etc.

In the first to tenth embodiments, the GaN single-crystal buffer layer may be replaced with a layer of SiC, II–VI Group compound semiconductor, Si, Ge, etc. Although the AlGaN layer is adopted as a layer exhibiting the function of a semiconductor device, such elements as In, Ti, Si, C or Ni may be contained in such an amount that no mixed crystal will form. The semiconductor device of the present invention is applicable to lasers, light-emission diodes having substantially the same structure as the lasers, compound-semiconductor light-receiving elements, or transistors such as hetero-junction bipolar transistors (HBT) and high-mobility transistors (HEMT).

In addition to the above-described means, the present invention covers the following means:

(1) A nitrogen-containing compound semiconductor device having epitaxial layers grown on a substrate of an oxide, the semiconductor device including at least one AlGaN layer, the total thickness of the AlGaN layer being more than half the total thickness of all epitaxial layers.

(2) The nitrogen-containing compound semiconductor of (1), wherein the substrate is formed of sapphire.

(3) A nitrogen-containing compound semiconductor device having epitaxial layers grown on a substrate, the semiconductor device including a buffer layer put in contact with the substrate; at least one AlGaN layer; and at least one single-crystal GaN layer of a thickness less than a critical film thickness, provided between the substrate and the AlGaN layer in contact with the AlGaN layer or provided within the AlGaN layer, wherein the total thickness of the AlGaN layer is more than half the total thickness of all epitaxial layers and the Al composition in the AlGaN layer is 10% or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A gallium nitride (GaN)-based semiconductor device comprising:

a substrate;

a first buffer layer formed on said substrate and not being made from a single-crystal;

a second buffer layer formed on said first buffer layer which is a single-crystal layer consisting mainly of GaN with a magnesium (Mg) concentration of $N_{bg1}$ cm$^{-3}$, the single-crystal layer having a thickness of $d_1$ μm;

a semiconductor layer consisting mainly of $Ga_{1-x}Al_xN$ having an Al composition x of at least 0.02 and not higher than 1 and having a thickness of $d_2$ μm, said single-crystal layer being situated between said substrate and said semiconductor layer, and Mg being added to said semiconductor layer at a concentration of $N_{Mg}$ cm$^{-3}$, and an active layer situated between said single-crystal layer and said semiconductor layer and formed to effect laser oscillation;

wherein said Al composition x, said concentration $N_{Mg}$, said concentration $N_{bg1}$, said thickness $d_1$ and said thickness $d_2$ have the following relationship:

$$d_1/(1600 \times x) < d_2 < 3.6 \times 10^{-3} \times \log N/(x+0.02) + 0.02$$

wherein when $N_{Mg} > N_{bg1}$, N cm$^{-3}$ = $N_{Mg} - N_{bg1}$, and when $N_{Mg} \leq N_{bg1}$, N is equal to an Mg background level in additive-free $Ga_{1-x}Al_xN$.

2. The GaN-based semiconductor device according to claim 1, further comprising:

an n-AlGaN cladding layer to which Mg is added as impurities at a concentration of $10^{19}$ cm$^{-3}$ or more, said n-AlGaN cladding layer and said semiconductor layer used as a p-type cladding layer sandwiching said active layer.

3. The GaN-based semiconductor device according to claim 1, wherein the total thickness of AlGaN layers including at least said semiconductor layer is at least half the total thickness of epitaxial layers including the semiconductor layer grown on said substrate.

4. The GaN-based semiconductor device according to claim 3, further comprising a buffer layer epitaxially grown in contact with said substrate, wherein the thickness of said single-crystal layer is less than a critical film thickness.

5. A gallium nitride (GaN)-based semiconductor light emission device comprising:

an active layer formed to effect laser oscillation;

a p-type cladding layer provided near said active layer; and an n-AlGaN cladding layer provided near said active layer such that said active layer is interposed between said p-type cladding layer and said n-AlGaN cladding layer, Mg being added to said n-AlGaN cladding layer as impurities at a concentration of $10^{19}$ cm$^{-3}$ or more.

6. The GaN-based semiconductor light emission device according to claim 5, wherein said active layer is formed to effect laser oscillation, and the thickness of said p-type cladding layer is set to be greater than that of said n-type cladding layer.

7. The GaN-based semiconductor light emission device according to claim 5, wherein said active layer is formed to effect laser oscillation, and an Al composition of said p-type cladding layer is set to be higher than that of said n-type cladding layer.

8. The GaN-based semiconductor light emission device according to claim 6, wherein an optical guide layer having an intermediate band gap between a band gap of said active layer and a band gap of each of said cladding layers is provided in one of a manner in which said optical guide layer is situated between said active layer and one of the cladding layers and a manner in which said optical guide layer is situated between said active layer and each of said cladding layers, and optical asymmetry between both cladding layers due to a difference in thickness therebetween is corrected by adjusting the thickness and composition of said optical guide layer.

9. A gallium nitride (GaN)-based semiconductor device comprising:

a substrate;

a buffer layer epitaxially grown in contact with the substrate;

at least one AlGaN layer epitaxially grown above said buffer layer; and at least one single-crystal GaN layer epitaxially grown near said substrate and having a thickness less than a critical film thickness, wherein the total thickness of said AlGaN layer or layers is more than half the total thickness of all epitaxial layers grown on said substrate.

10. A gallium nitride (GaN)-based semiconductor device comprising:

a substrate; and either (1):

a first buffer layer formed on said substrate and not being made from a single-crystal;

a second buffer layer formed on said first buffer layer which is a single-crystal layer consisting mainly of GaN with a magnesium (Mg) concentration of $N_{bg1}$ cm$^{-3}$, the single-crystal layer having a thickness of $d_1$ μm;

a semiconductor layer consisting mainly of $Ga_{1-x}Al_xN$ having an Al composition x of at least 0.02 and not higher than 1 and having a thickness of $d_2$ μm, said single-crystal layer being situated between said substrate and said semiconductor layer, and Mg being added to said semiconductor layer at a concentration of $N_{Mg}$ cm$^{-3}$, and an active layer situated between said single-crystal layer and said semiconductor layer and formed to effect laser oscillation;

wherein said Al composition x, said concentration $N_{Mg}$, said concentration $N_{bg1}$, said thickness $d_1$ and said thickness $d_2$ have the following relationship:

$$d_1/(1600 \times x) < d_2 < 3.6 \times 10^{-3} \times \log N/(x+0.02)+0.02$$

wherein when $N_{Mg} > N_{bg1}$, $N \text{cm}^{-3} = N_{Mg} - N_{bg1}$, and when $N_{Mg} \leq N_{bg1}$, N is equal to an Mg background level in additive-free $Ga_{1-x}Al_xN$, or (2):

a first buffer layer formed on said substrate and not being made from a single-crystal;

a second buffer layer formed on said first buffer layer which is a single-crystal layer consisting mainly of GaN with a silicon (Si) concentration of $N_{bg2}$ cm$^{-3}$, the single-crystal layer having a thickness of $d_1$ μm; and a semiconductor layer consisting mainly of $Ga_{1-x}Al_xN$ having an Al composition x of at least 0.02 and not higher than 1 and having a thickness of $d_2$ μm, said single-crystal layer being situated between said substrate and said semiconductor layer, and Si being added to said semiconductor layer at a concentration of $N_{Si}$ cm$^{-3}$, wherein said Al composition x, said concentration $N_{Si}$, said concentration $N_{bg2}$, said thickness $d_1$ and said thickness $d_2$ have the following relationship:

$$d_1/(1600 \times x) < d_2 < 3.2 \times 10^{-3} \times \log N'/(x+0.02)+0.02$$

wherein when $N_{Si} > N_{bg2}$, $N' \text{cm}^{-3} = N_{Si} - N_{bg2}$, and when $N_{Si} \leq N_{bg2}$, N' is equal to an Si background level in additive-free $Ga_{1-x}Al_xN$.

* * * * *